United States Patent
Lin et al.

(10) Patent No.: US 12,051,594 B2
(45) Date of Patent: Jul. 30, 2024

(54) METHOD FOR FORMING SEMICONDUCTOR DEVICE STRUCTURE WITH GATE

(71) Applicant: Taiwan Semiconductor Manufacturing Company, Ltd., Hsinchu (TW)

(72) Inventors: Kuei-Lun Lin, Keelung (TW); Yen-Fu Chen, Taipei (TW); Da-Yuan Lee, Jhubei (TW); Tsung-Da Lin, Pingtung County (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 473 days.

(21) Appl. No.: 17/374,264

(22) Filed: Jul. 13, 2021

(65) Prior Publication Data
US 2022/0285160 A1   Sep. 8, 2022

Related U.S. Application Data

(60) Provisional application No. 63/157,008, filed on Mar. 5, 2021.

(51) Int. Cl.
*H01L 21/8234* (2006.01)
*H01L 21/28* (2006.01)
(Continued)

(52) U.S. Cl.
CPC .. *H01L 21/28114* (2013.01); *H01L 21/28194* (2013.01); *H01L 21/823431* (2013.01);
(Continued)

(58) Field of Classification Search
CPC ......... H01L 21/28114; H01L 21/28194; H01L 21/823431; H01L 29/401; H01L 29/66545; H01L 29/66795; H01L 29/165; H01L 29/4966; H01L 29/7848; H01L 21/02181; H01L 21/02205; H01L 21/02274; H01L 21/0228; H01L 29/0673; H01L 29/42364; H01L 29/42392; H01L 29/517;
(Continued)

(56) References Cited

U.S. PATENT DOCUMENTS 9,209,247 B2   12/2015   Colinge et al.
9,236,267 B2   1/2016    De et al.
(Continued)

OTHER PUBLICATIONS

Wolf et al. "Silicon Processing for the VLSI Era", Second Edition, vol. 1, p. 195. Lattice Press (Year: 2000).*

*Primary Examiner* — Suberr L Chi
(74) *Attorney, Agent, or Firm* — Birch, Stewart, Kolasch & Birch, LLP

(57) ABSTRACT

A method for forming a semiconductor device structure is provided. The method includes providing a substrate and an insulating layer over the substrate. The method includes depositing a gate dielectric layer over the insulating layer and in the wide trench and the narrow trench using an atomic layer deposition process. The method includes forming a gate electrode layer over the gate dielectric layer. The method includes removing the gate dielectric layer and the gate electrode layer outside of the wide trench and the narrow trench.

20 Claims, 27 Drawing Sheets

(51) Int. Cl.
*H01L 29/40* (2006.01)
*H01L 29/66* (2006.01)

(52) U.S. Cl.
CPC ...... *H01L 29/401* (2013.01); *H01L 29/66545* (2013.01); *H01L 29/66795* (2013.01)

(58) Field of Classification Search
CPC ............ H01L 29/66439; H01L 29/775; H01L 29/78696; H01L 21/823462; H01L 21/823468; H01L 21/823481; H01L 29/7831; H01L 29/785; B82Y 10/00
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,799,565 B2 * | 10/2017 | Chang ............. H01L 21/823431 |
| 2014/0001540 A1 * | 1/2014 | Wang ............. H01L 21/823857 |
| | | 257/329 |
| 2016/0293493 A1 * | 10/2016 | Fan ..................... H01L 27/0924 |
| 2019/0371675 A1 * | 12/2019 | Tsai ................ H01L 21/823431 |
| 2020/0161170 A1 * | 5/2020 | Kao .................. H01L 21/76224 |
| 2021/0082706 A1 * | 3/2021 | Yu ................... H01L 21/823807 |
| 2022/0085006 A1 * | 3/2022 | Kim ................ H01L 21/823456 |

* cited by examiner

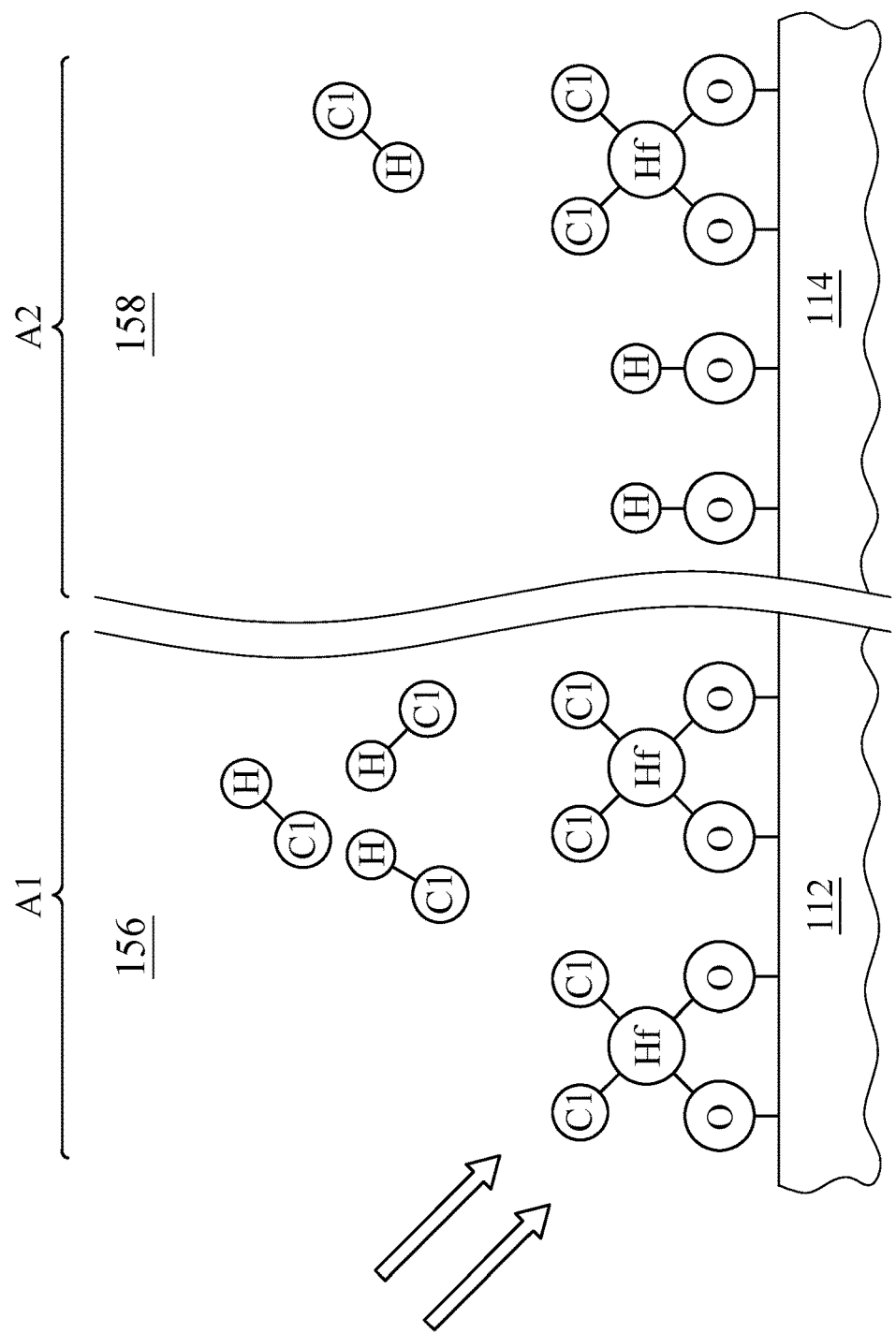

METHOD FOR FORMING SEMICONDUCTOR DEVICE STRUCTURE WITH GATE

PRIORITY CLAIM AND CROSS-REFERENCE

This Application claims the benefit of U.S. Provisional Application No. 63/157,008, filed on Mar. 5, 2021, and entitled "SEMICONDUCTOR DEVICE STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 2I-1 is a perspective view of the semiconductor device structure of FIG. 2I, in accordance with some embodiments.

FIGS. 2F-1 to 2F-5 are cross-sectional views of various stages of an atomic layer deposition process for forming the gate dielectric layer, which is made of $HfO_2$, in the regions A1 and A2 of FIG. 2F, in accordance with some embodiments.

FIG. 3A-1 is a perspective view of the semiconductor device structure of FIG. 3A, in accordance with some embodiments.

FIG. 3C-1 is a perspective view of the semiconductor device structure of FIG. 3C, in accordance with some embodiments.

FIG. 3C-2 is a cross-sectional view illustrating the semiconductor device structure along a sectional line 3C-2-3C-2' in FIG. 3C-1, in accordance with some embodiments.

FIG. 3C-3 is a cross-sectional view illustrating the semiconductor device structure along a sectional line 3C-3-3C-3' in FIG. 3C-1, in accordance with some embodiments.

DETAILED DESCRIPTION

Figure 1A:
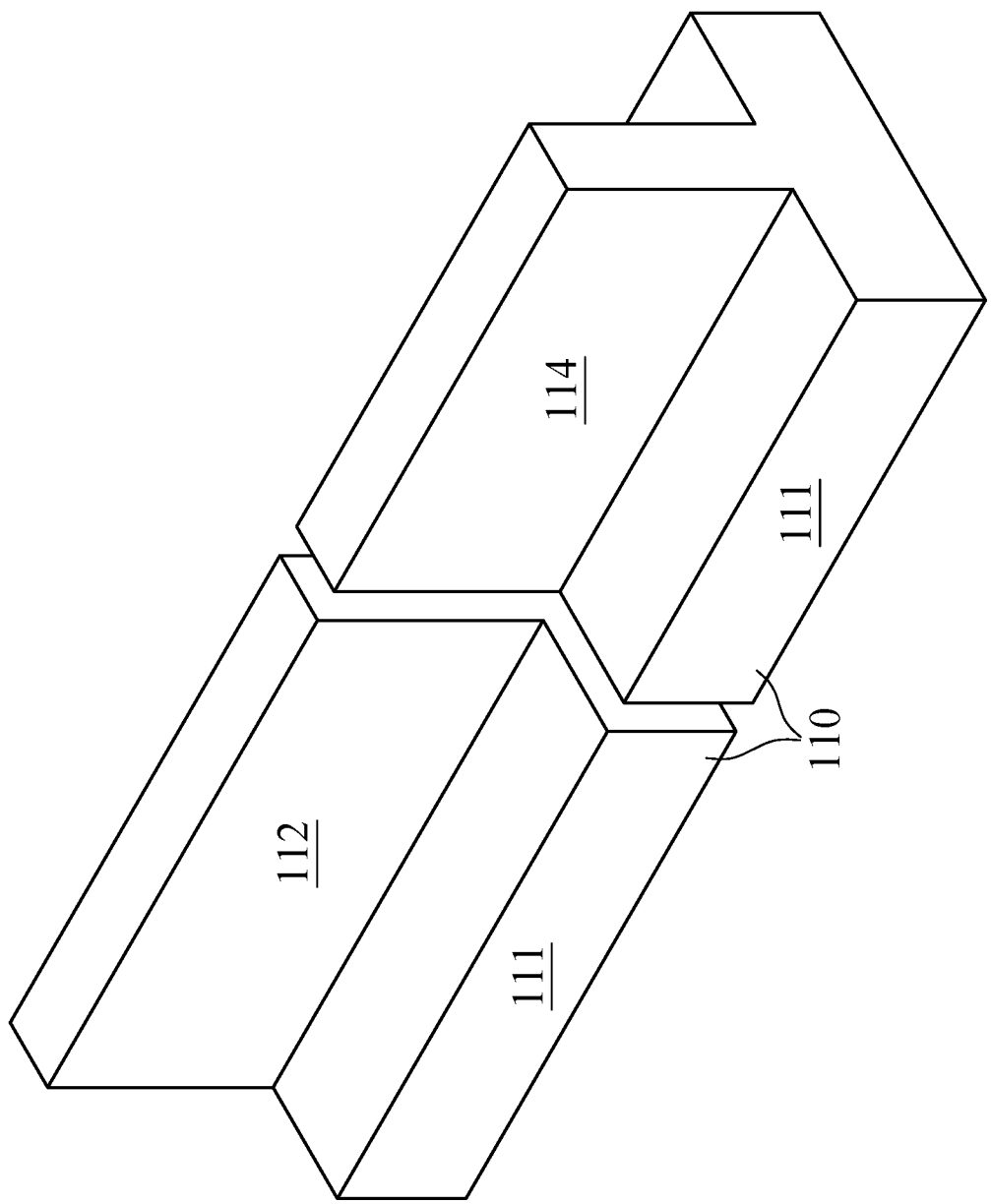
FIGS. 1A-1B are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
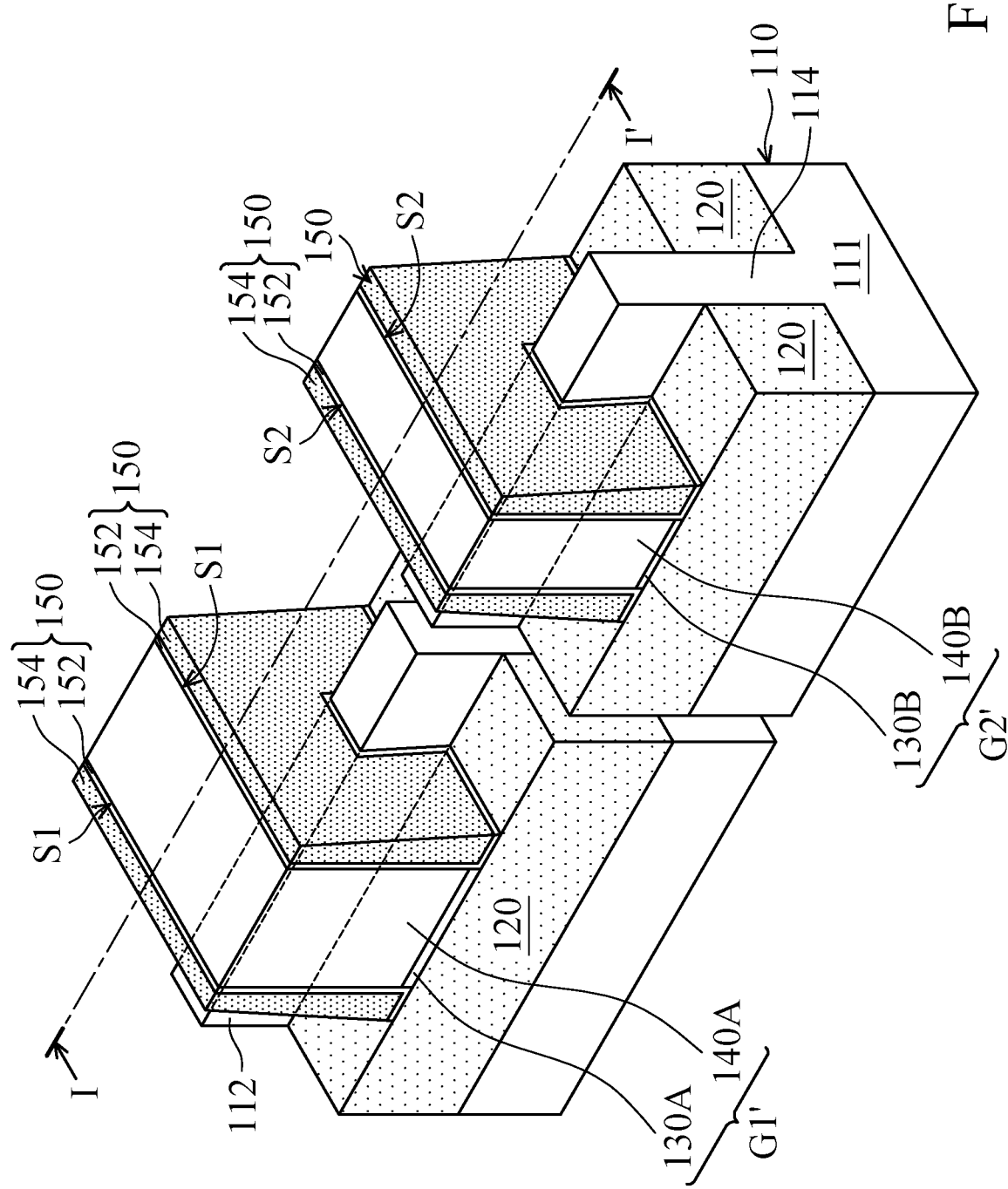

FIGS. 1A-1B are perspective views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof.

The substrate 110 may also include multi-layer semiconductors, semiconductor on insulator (SOI) (such as silicon on insulator or germanium on insulator), or a combination thereof. As shown in FIG. 1A, the substrate 110 has a base 111 and fin structures 112 and 114, in accordance with some embodiments.

The fin structures 112 and 114 are over the base 111, in accordance with some embodiments. The base 111 is a continuous structure, in accordance with some embodiments. For the sake of simplicity, the base 111 between the fin structures 112 and 114 are omitted in FIG. 1A, in accordance with some embodiments. In some embodiments, the fin structures 112 and 114 are spaced apart from each other. In some other embodiments, the fin structures 112 and 114 are connected with each other and together form a fin structure.

Figure 2A:
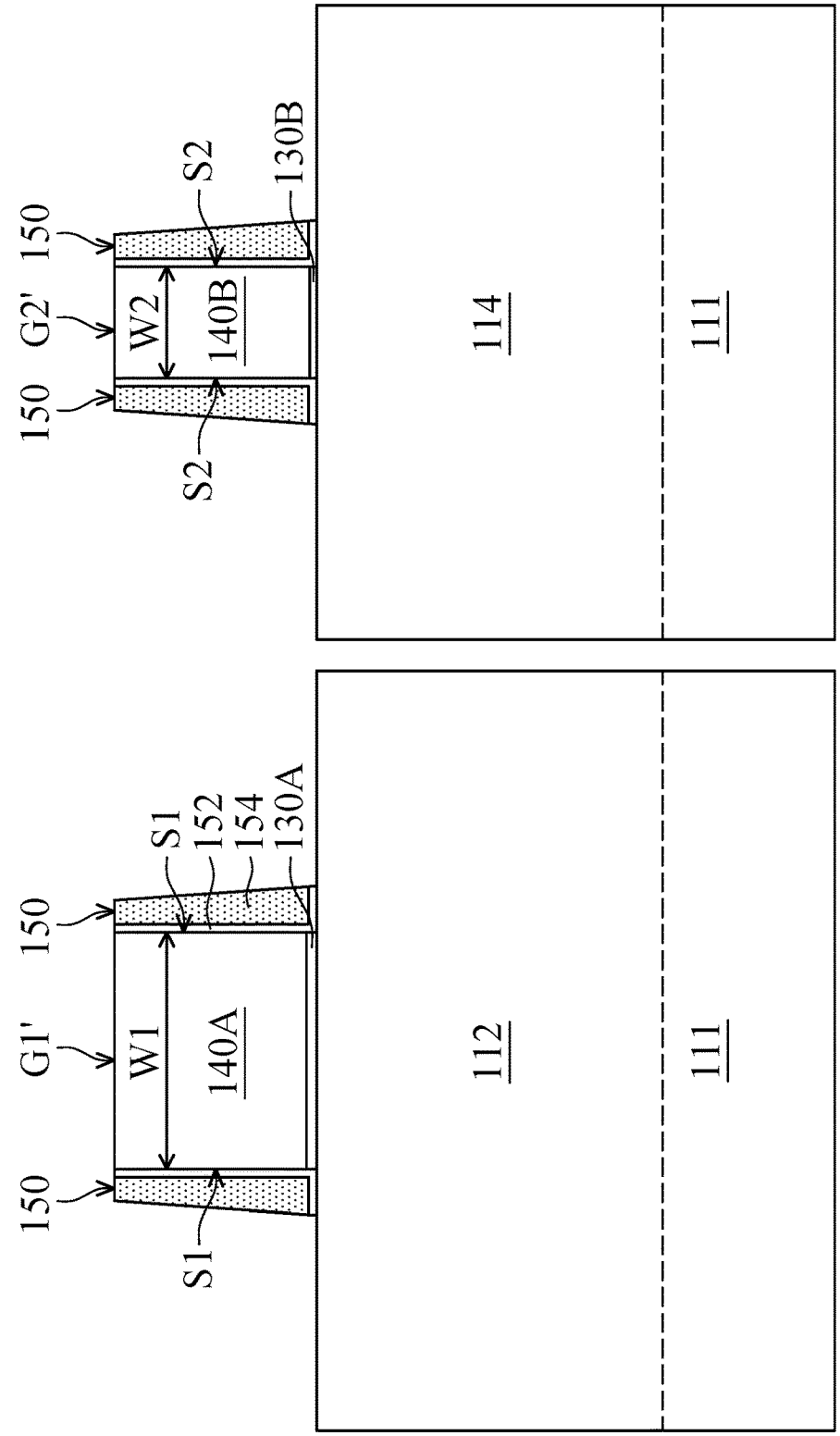
FIGS. 2A-2L are cross-sectional views of various stages of a process for forming a semiconductor device structure, in accordance with some embodiments.

FIG. 1B is a perspective view of the semiconductor device structure of FIG. 2A, in accordance with some embodiments. FIG. 2A is a cross-sectional view illustrating the semiconductor device structure along a sectional line I-I' in FIG. 1B, in accordance with some embodiments.

As shown in FIGS. 1B and 2A, an isolation layer 120 is formed over the base 111, in accordance with some embodiments. The fin structures 112 and 114 are partially in the isolation layer 120, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

As shown in FIGS. 1B and 2A, gate structures G1' and G2' are respectively formed over the fin structures 112 and 114, in accordance with some embodiments. The gate structures G1' and G2' are also referred to as dummy gate structures, in accordance with some embodiments.

The gate structure G1' is wider than the gate structure G2', in accordance with some embodiments. That is, a width W1 of the gate structure G1' is greater than a width W2 of the gate structure G2', in accordance with some embodiments. The width W1 ranges from about 100 nm to about 200 nm, in accordance with some embodiments. The width W2 ranges from about 2 nm to about 10 nm, in accordance with some embodiments. In some embodiments, a ratio of the width W1 to the width W2 ranges from about 10 to about 100.

The gate structure G1' wraps around an upper portion of the fin structure 112, in accordance with some embodiments. The gate structure G1' has a gate dielectric layer 130A and a gate electrode 140A, in accordance with some embodiments. The gate electrode 140A is over the gate dielectric layer 130A, in accordance with some embodiments.

As shown in FIG. 2A, the gate dielectric layer 130A is positioned between the gate electrode 140A and the fin structure 112, in accordance with some embodiments. As shown in FIG. 1B, the gate dielectric layer 130A is also positioned between the gate electrode 140A and the isolation layer 120, in accordance with some embodiments.

The gate structure G2' wraps around an upper portion of the fin structure 114, in accordance with some embodiments. The gate structure G2' has a gate dielectric layer 130B and a gate electrode 140B, in accordance with some embodiments. The gate electrode 140B is over the gate dielectric layer 130B, in accordance with some embodiments.

As shown in FIG. 2A, the gate dielectric layer 130B is positioned between the gate electrode 140B and the fin structure 114, in accordance with some embodiments. As shown in FIG. 1B, the gate dielectric layer 130B is also positioned between the gate electrode 140B and the isolation layer 120, in accordance with some embodiments.

The gate dielectric layers 130A and 130B are made of an oxide-containing material such as silicon oxide, in accordance with some embodiments. The gate dielectric layers 130A and 130B are formed using a chemical vapor deposition process (CVD process) and an etching process, in accordance with some embodiments.

The gate electrodes 140A and 140B are made of a semiconductor material such as polysilicon, in accordance with some embodiments. The electrodes 140A and 140B are formed using a chemical vapor deposition process and an etching process, in accordance with some embodiments.

As shown in FIGS. 1B and 2A, a spacer structure 150 is formed over sidewalls S1 and S2 of the gate structures G1' and G2', in accordance with some embodiments. The spacer structure 150 surrounds the gate structures G1' and G2', in accordance with some embodiments. The spacer structure 150 is positioned over the fin structures 112 and 114 and the isolation layer 120, in accordance with some embodiments.

The spacer structure 150 includes a protective layer 152 and a spacer layer 154, in accordance with some embodiments. The protective layer 152 conformally covers the sidewalls S1 and S2 of the gate structures G1' and G2' and the isolation layer 120, in accordance with some embodiments. The spacer layer 154 is formed over the protective layer 152, in accordance with some embodiments.

The protective layer 152 is used to prevent the spacer layer 154 from damage during subsequent processes, such as a dummy gate removal process, in accordance with some embodiments. The protective layer 152 includes nitride or carbide, in accordance with some embodiments. The protective layer 152 is made of silicon nitride, silicon oxynitride, or silicon carbide, in accordance with some embodiments. The protective layer 152 is formed by an atomic layer deposition process, a chemical vapor deposition process, or a physical vapor deposition process, in accordance with some embodiments.

The spacer layer 154 is used to electrically insulate a gate structure from contact structures, which are formed in subsequent processes, in accordance with some embodiments. The protective layer 152 and the spacer layer 154 are made of different materials to improve the etch selectivity of the protective layer 152 to the spacer layer 154, in accordance with some embodiments.

The spacer layer 154 is made of insulating materials, such as silicon oxide, silicon nitride, silicon oxynitride, or silicon carbide, in accordance with some embodiments. The formation of the spacer layer 154 includes a deposition process and an anisotropic etching process, in accordance with some embodiments.

Figure 2B:
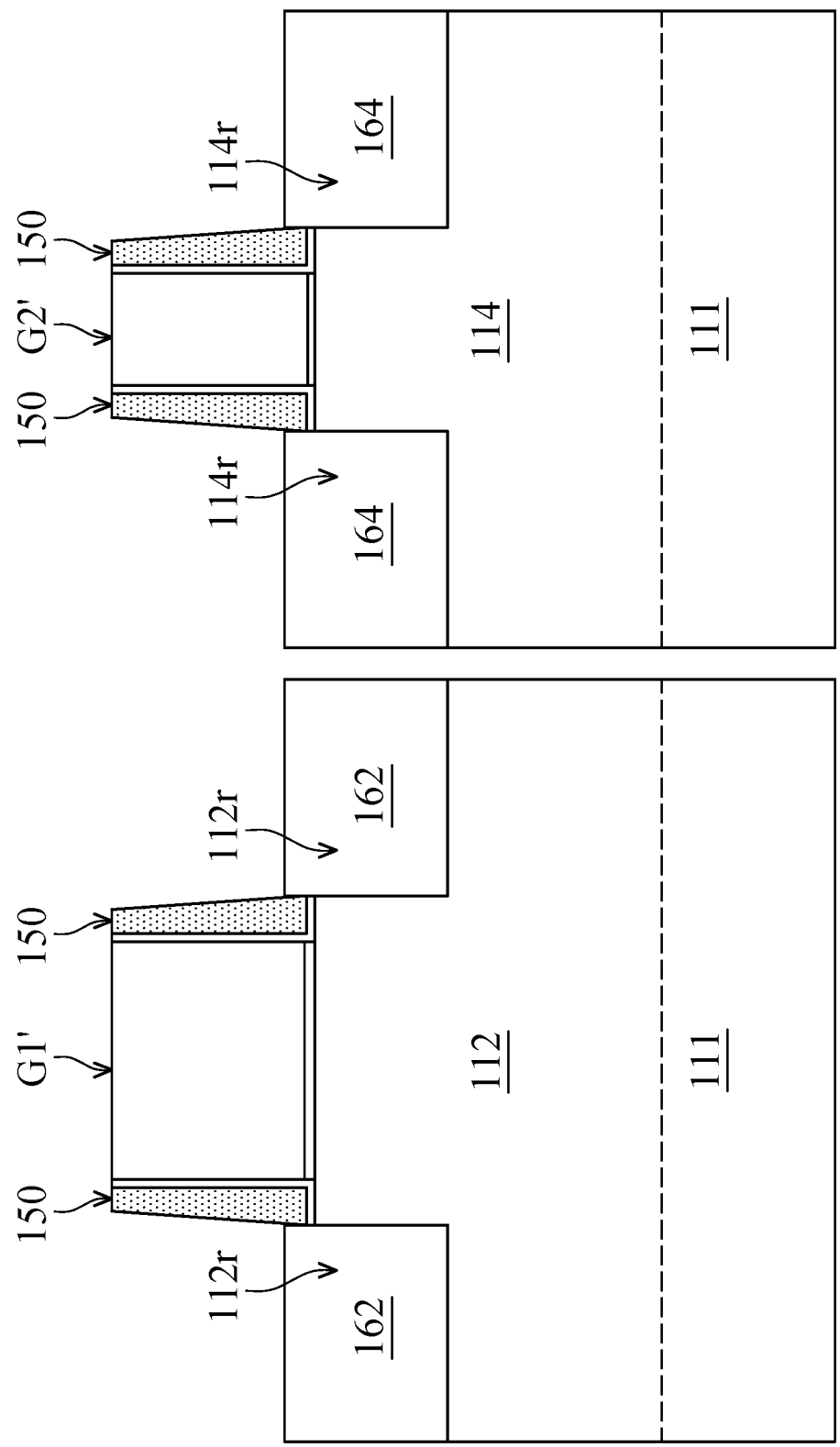

FIGS. 2A-2L are cross-sectional views of various stages of a process for forming a semiconductor device structure, in accordance with some embodiments. After the step of FIG. 2A, as shown in FIG. 2B, portions of the fin structures 112 and 114, which are not covered by the gate structures G1' and G2' and the spacer structure 150, are removed to respectively form recesses 112r and 114r in the fin structures 112 and 114, in accordance with some embodiments. The removal process includes an etching process, such as a dry etching process, in accordance with some embodiments.

As shown in FIG. 2B, stressors 162 and 164 are respectively formed in the recesses 112r and 114r of the fin structures 112 and 114, in accordance with some embodiments. The stressors 162 are in direct contact with the fin structure 112, in accordance with some embodiments. The stressors 164 are in direct contact with the fin structure 114, in accordance with some embodiments.

The stressors 162 are positioned on two opposite sides of the gate structure G1', in accordance with some embodiments. The stressors 164 are positioned on two opposite sides of the gate structure G2', in accordance with some embodiments. In some embodiments, the stressors 162 include a source structure and a drain structure. In some embodiments, the stressors 164 include a source structure and a drain structure.

In some embodiments, the stressors 162 and 164 are made of a semiconductor material (e.g., silicon) with N-type dopants, such as the Group VA element, in accordance with some embodiments. The Group VA element includes phosphor (P), antimony (Sb), or another suitable Group VA material.

In some other embodiments, the stressors 162 and 164 are made of a semiconductor material (e.g., silicon germanium) with P-type dopants, such as the Group IIIA element, in accordance with some embodiments. The Group IIIA element includes boron or another suitable material. The stressors 162 and 164 are formed using an epitaxial process, in accordance with some embodiments.

Figure 2C:
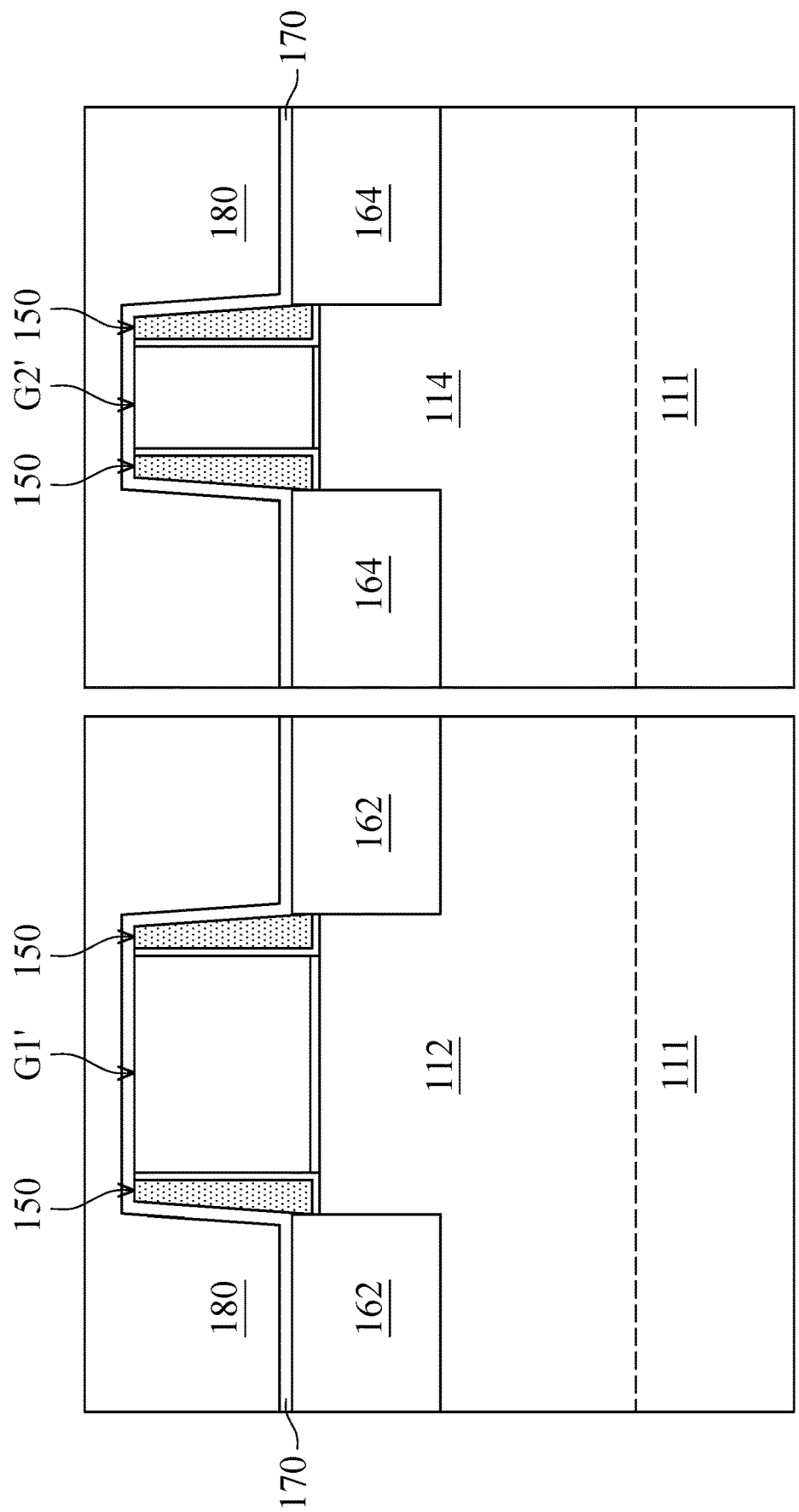

As shown in FIGS. 1B and 2C, an etch stop layer 170 is deposited over the gate structures G1' and G2', the spacer structure 150, the isolation layer 120, and the stressors 162 and 164, in accordance with some embodiments. In some embodiments, the etch stop layer 170 is made of silicon carbide, silicon nitride, silicon oxynitride, silicon carbonitride, or the like.

In some other embodiments, the etch stop layer 170 is made of a metal nitride, a metal carbide, a metal oxide, and/or the like, and the metal may include aluminum (Al), manganese (Mn), copper (Cu), or multi-layers thereof. The etch stop layer 170 is formed by a deposition process such as a chemical vapor deposition (CVD) process, in accordance with some embodiments.

As shown in FIG. 2C, an insulating layer 180 is formed over the etch stop layer 170, in accordance with some embodiments. The etch stop layer 170 and the insulating layer 180 are made of different materials to improve the etch selectivity of the etch stop layer 170 to the insulating layer 180, in accordance with some embodiments.

The insulating layer 180 includes an oxide-containing material such as silicon oxide, in accordance with some embodiments. The insulating layer 180 is formed by a deposition process such as a chemical vapor deposition (CVD) process, in accordance with some embodiments.

Figure 2D:
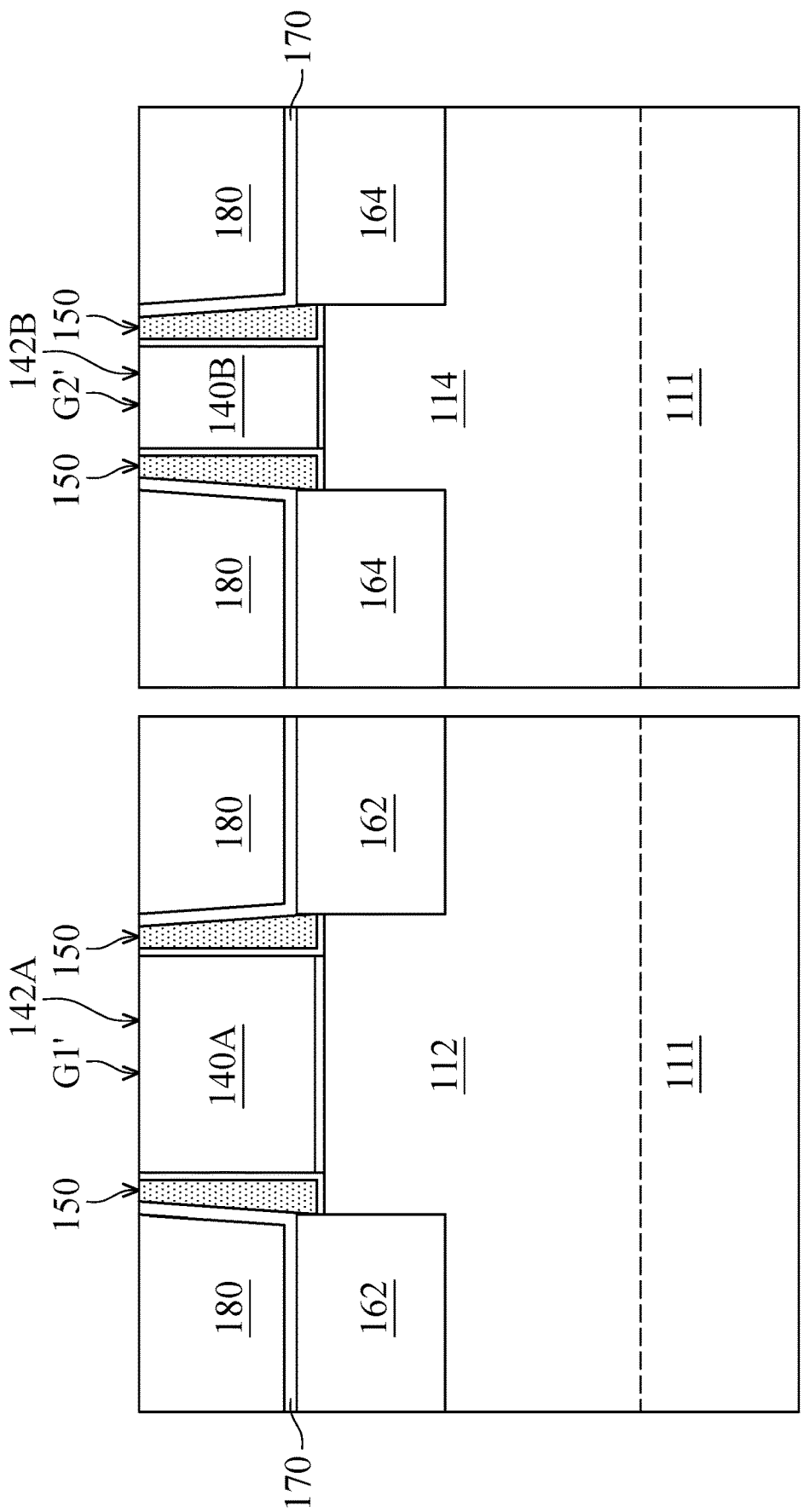

As shown in FIG. 2D, a planarization process is then performed on the insulating layer 180 until top surfaces 142A and 142B of the gate electrodes 140A and 140B are exposed, in accordance with some embodiments. The planarization process includes a chemical mechanical polishing (CMP) process, in accordance with some embodiments.

Figure 2E:
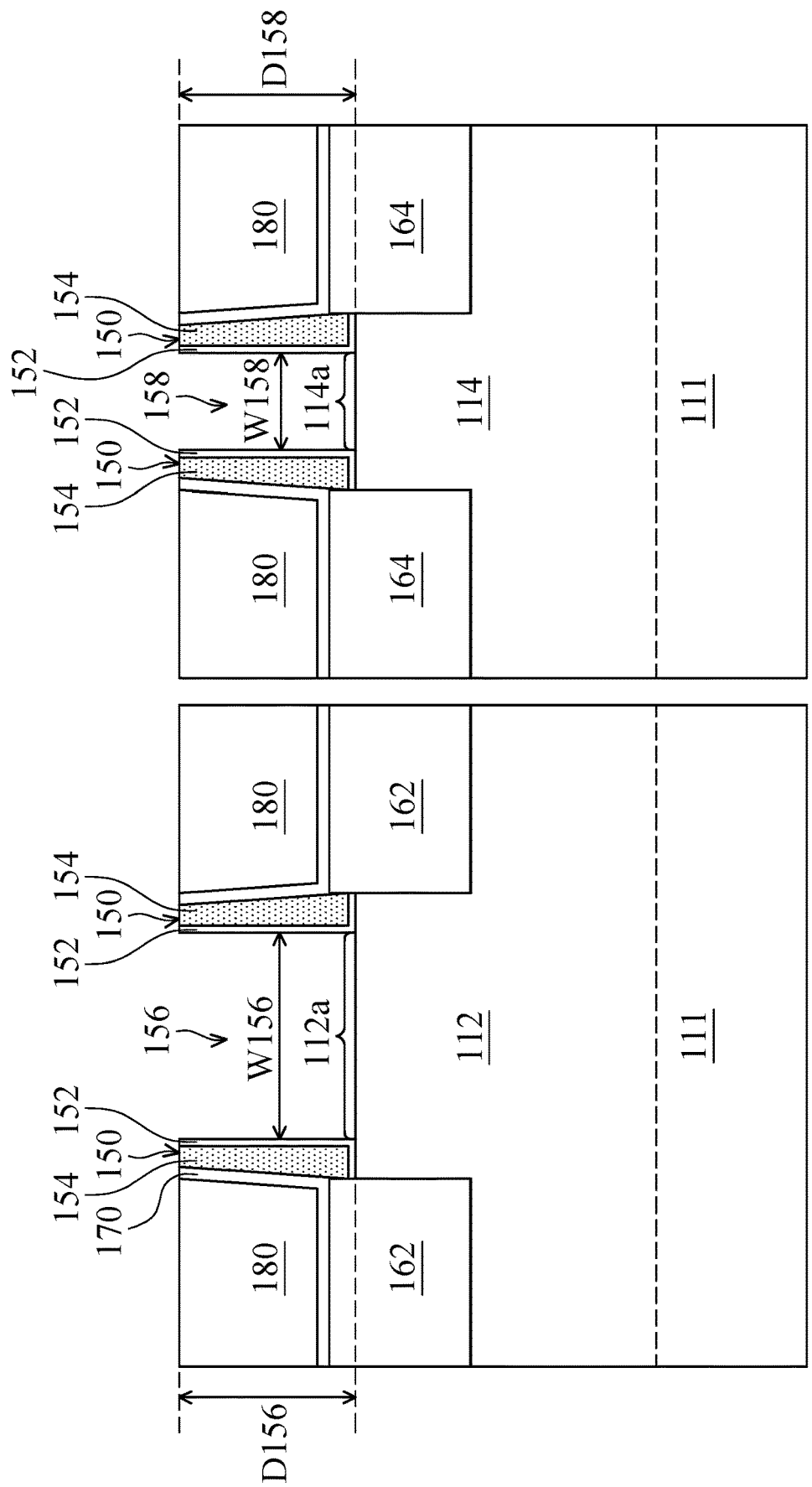

As shown in FIG. 2E, the gate structures GI and G2' are removed, in accordance with some embodiments. The removal process is also referred to as a dummy gate removal process, in accordance with some embodiments. The removal process includes a wet etching process, in accordance with some embodiments. The protective layer 152 prevents the spacer layer 154 from being etched during the wet etching process, in accordance with some embodiments.

After the removal process, a wide trench 156 and a narrow trench 158 are formed in the spacer structure 150, in accordance with some embodiments. The wide trench 156 is wider than the narrow trench 158, in accordance with some embodiments. That is, a width W156 of the wide trench 156 is greater than a width W158 of the narrow trench 158, in accordance with some embodiments.

The width W156 ranges from about 100 nm to about 200 nm, in accordance with some embodiments. The width W158 ranges from about 2 nm to about 10 nm, in accordance with some embodiments. In some embodiments, a ratio of the width W156 to the width W158 ranges from about 10 to about 100.

In some embodiments, a depth D156 of the wide trench 156 ranges from about 50 nm to about 100 nm. In some embodiments, a depth D158 of the narrow trench 158 ranges from about 50 nm to about 100 nm. In some embodiments, the depth D156 is substantially equal to the depth D158. Therefore, the depth-to-width aspect ratio (D156/W156) of the wide trench 156 is less than the depth-to-width aspect ratio (D158/W158) of the narrow trench 158, in accordance with some embodiments. In some other embodiments (not shown), the depth D156 is different from the depth D158.

The wide trench 156 exposes a portion 112a of the fin structure 112, in accordance with some embodiments. The narrow trench 158 exposes a portion 114a of the fin structure 114, in accordance with some embodiments.

Figure 2F:
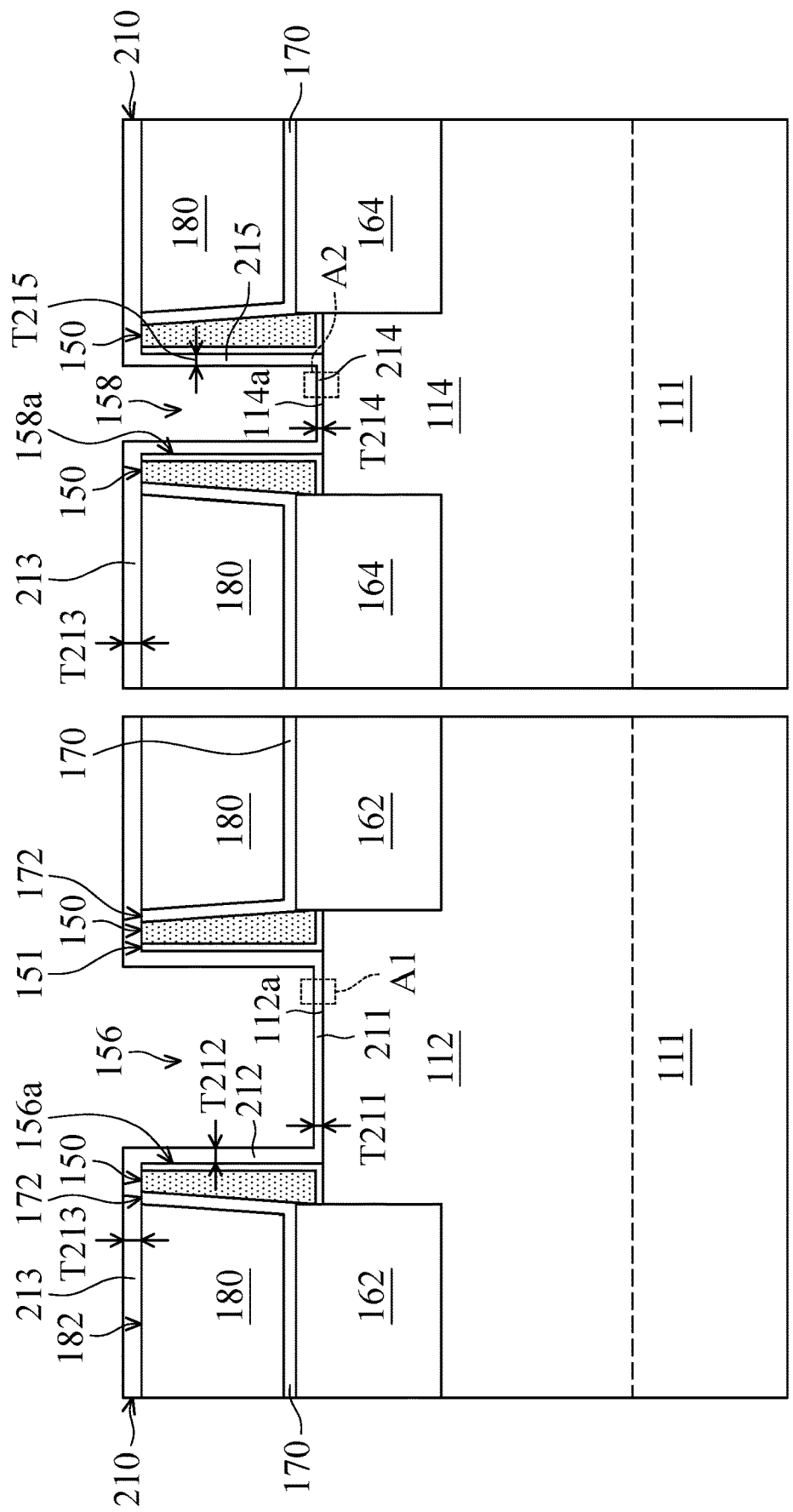

As shown in FIG. 2F, a gate dielectric layer 210 is deposited over the insulating layer 180, the etch stop layer 170, the spacer structure 150, and the portions 112a and 114a of the fin structures 112 and 114 using an atomic layer deposition process, in accordance with some embodiments. The atomic layer deposition process includes a plasma-enhanced atomic layer deposition (PE-ALD) process, in accordance with some embodiments.

The gate dielectric layer 210 conformally and continuously covers the insulating layer 180, the etch stop layer 170, the spacer structure 150 and the portions 112a and 114a, in accordance with some embodiments. The gate dielectric layer 210 is formed in the wide trench 156 and the narrow trench 158 simultaneously, in accordance with some embodiments. The gate dielectric layer 210 in the narrow trench 158 is thinner than the gate dielectric layer 210 in the wide trench 156, in accordance with some embodiments.

The gate dielectric layer 210 in the narrow trench 158 is used to be a gate dielectric layer of a short channel transistor, which is formed in subsequent processes, in accordance with some embodiments. The gate dielectric layer 210 in the wide trench 156 is used to be a gate dielectric layer of a long channel transistor, which is formed in subsequent processes, in accordance with some embodiments.

In the short channel transistor, since the gate dielectric layer 210 in the narrow trench 158 is thin, the threshold voltage of the short channel transistor is reduced, in accordance with some embodiments. As a result, the driving current is improved (when the short channel transistor is in the on state), the leakage current is reduced (when the short channel transistor is in the off state), and the switching speed is improved, in accordance with some embodiments. Therefore, the performance of the short channel transistor is improved, in accordance with some embodiments. The short channel transistor is used as a high-speed device, a memory device, a logic device, or another suitable device, in accordance with some embodiments.

Furthermore, since the gate dielectric layer 210 in the narrow trench 158 is thin, more trench space is left to accommodate work function layers and a gate electrode layer formed in subsequent processes, which helps the gate electrode layer to fill the narrow trench 158, in accordance with some embodiments.

In the long channel transistor, since the gate dielectric layer 210 in the wide trench 156 is thick, the long channel transistor is able to withstand a high voltage, in accordance with some embodiments. Therefore, the long channel transistor is able to be used as a high-voltage device, in accordance with some embodiments. In some embodiments, the long channel transistor is used as a logic device.

In some embodiments, a dielectric constant of the gate dielectric layer 210 is greater than a dielectric constant of silicon dioxide. The gate dielectric layer 210 is also referred to as a high dielectric-constant (high-k) layer, in accordance with some embodiments.

The gate dielectric layer 210 is made of a high-k dielectric material, such as hafnium dioxide ($HfO_2$), zirconium dioxide ($ZrO_2$), aluminum oxide ($Al_2O_3$), hafnium dioxide-alumina alloy, hafnium silicon oxide, hafnium silicon oxynitride, hafnium tantalum oxide, hafnium titanium oxide, hafnium zirconium oxide (HfZrO), another suitable high-K material, or a combination thereof.

In some embodiments, a precursor used in the atomic layer deposition process includes an inorganic precursor. The inorganic precursor includes chlorine, in accordance with some embodiments. The inorganic precursor has a smaller chemisorption force than that of an organic precursor, which helps the formation of the gate dielectric layer 210 with different thicknesses in different trenches, in accordance with some embodiments. The organic precursor includes tetrakis (diethylamino) hafnium (TEMAHf), in accordance with some embodiments.

If the gate dielectric layer 210 is made of $HfO_2$, the precursor includes $HfCl_4$ and $H_2O$, in accordance with some embodiments. If the gate dielectric layer 210 is made of $ZrO_2$, the precursor includes $ZrCl_4$ and $H_2O$, in accordance with some embodiments.

If the gate dielectric layer 210 is made of $HfZrO_2$, the precursor includes $HfCl_4$, $ZrCl_4$, and $H_2O$, in accordance with some embodiments. If the gate dielectric layer 210 is made of $Al_2O_3$, the precursor includes $AlCl_3$ and $H_2O$, in accordance with some embodiments.

In some embodiments, a process temperature of the atomic layer deposition process ranges from about 400° C. to about 450° C. The chemisorption force (or the adhesion or the sticking coefficient) of the ALD precursor is decreased when the process temperature is increased, in accordance with some embodiments. If the process temperature is less than 400° C., the chemisorption force of the ALD precursor is large, which is not conducive to the formation of the gate dielectric layer 210 with different thicknesses in different trenches with different aspect ratios, in accordance with some embodiments. If the process temperature is greater than 450° C., the ALD precursor tends to decompose, in accordance with some embodiments.

The detail process of the atomic layer deposition process for forming the gate dielectric layer 210, which is made of $HfO_2$, is illustrated below. FIGS. 2F-1 to 2F-5 are cross-sectional views of various stages of an atomic layer deposition (ALD) process for forming the gate dielectric layer 210, which is made of $HfO_2$, in the regions A1 and A2 of FIG. 2F, in accordance with some embodiments.

Figures 1, 2F:
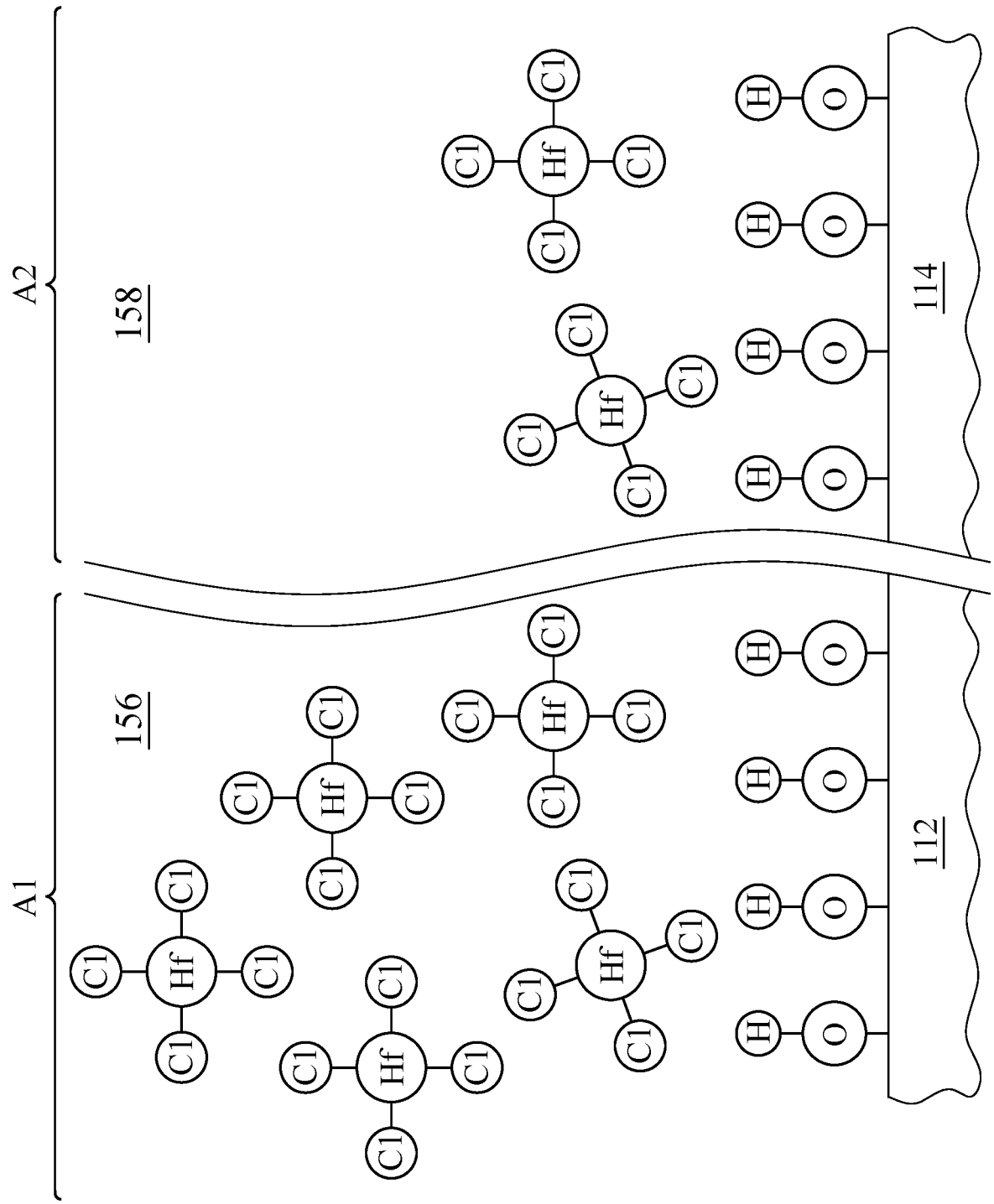

As shown in FIG. 2F-1, $HfCl_4$ (i.e., a hafnium precursor or a first precursor) is pulsed onto the (OH-terminated) surfaces of the fin structures 112 and 114, in accordance with some embodiments. Since the wide trench 156 is wider than the narrow trench 158, the concentration of the hafnium precursor in the wide trench 156 is greater than the concentration of the hafnium precursor in the narrow trench 158, in accordance with some embodiments.

Figures 2, 2F, 3:
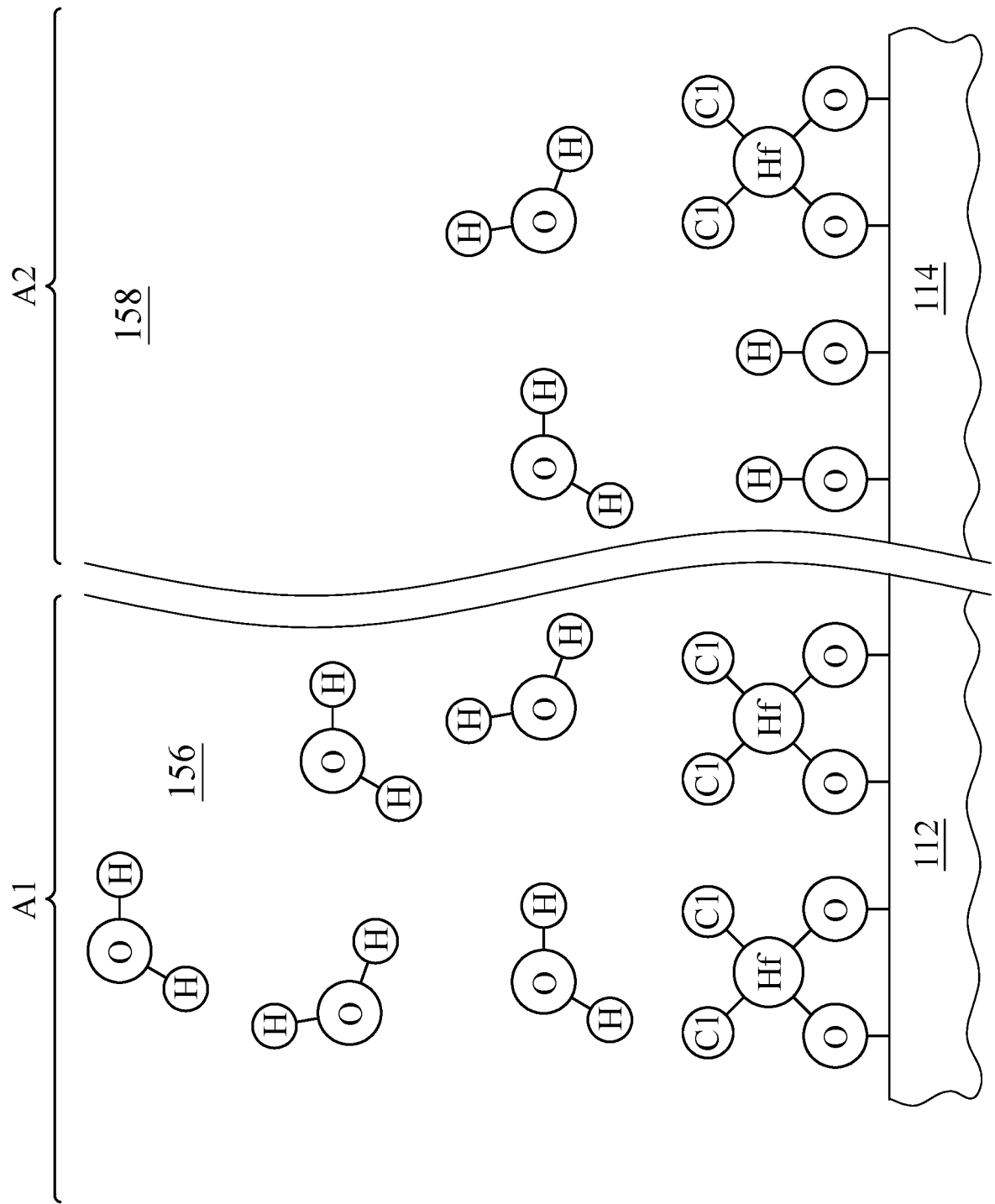
Figures 2, 2F, 3, 4:
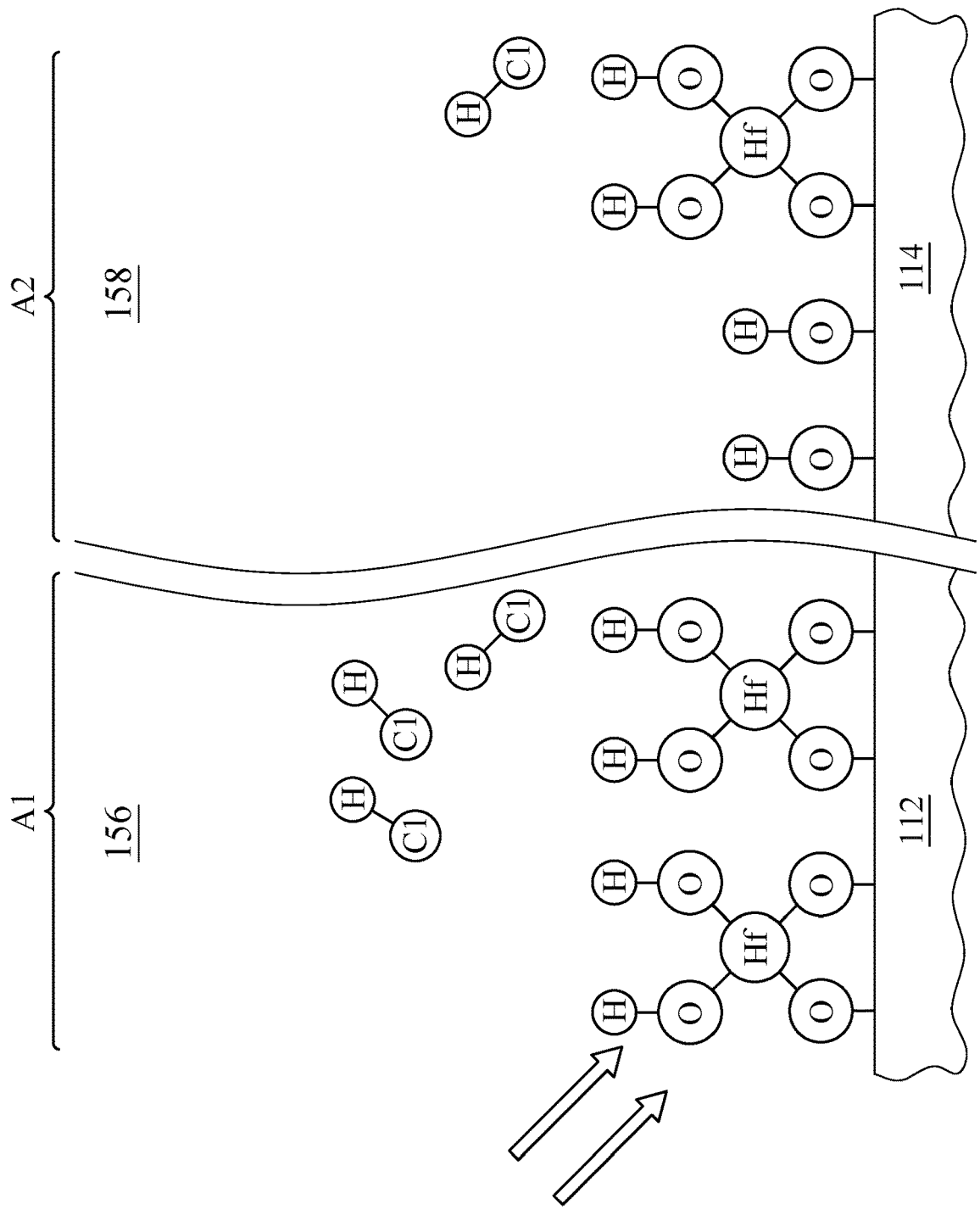
Figures 2, 2F, 3, 4, 5:
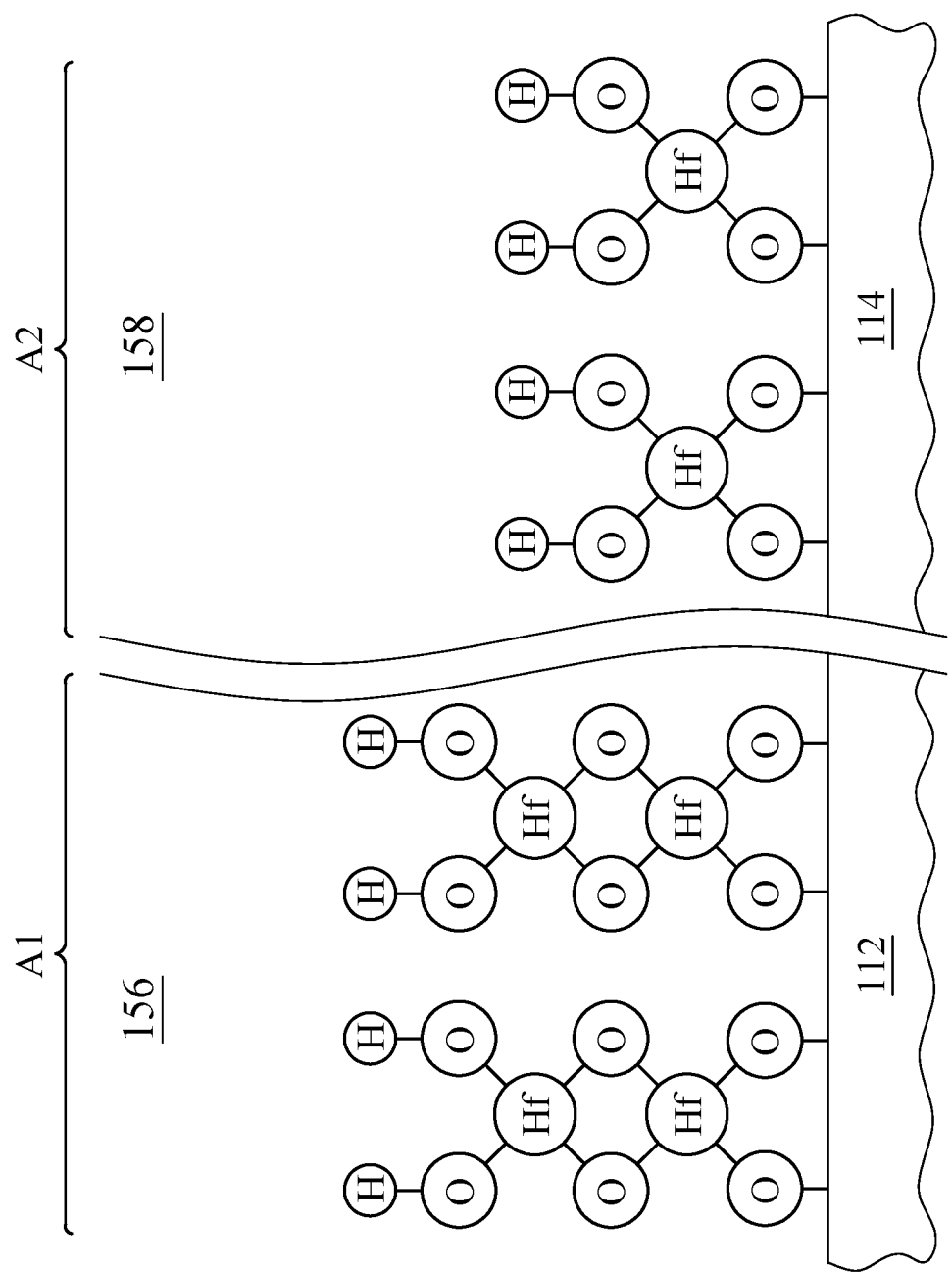

As shown in FIG. 2F-2, the hafnium precursor is chemisorbed on the available surface sites (i.e., OH groups) of the surfaces of the fin structures 112 and 114, and a by-product including hydrogen chloride (HCl) is produced, in accordance with some embodiments. As shown in FIG. 2F-2, the excess hafnium precursor and the by-product are purged away by flowing an inert gas, such as nitrogen ($N_2$) or argon (Ar), in accordance with some embodiments.

Since the hafnium precursor is an inorganic precursor and the process temperature of the atomic layer deposition process is high (e.g., about 400° C. to about 450° C.), the chemisorption force (or the adhesion) of the hafnium precursor is decreased, in accordance with some embodiments.

In the wide trench 156, although the chemisorption force of the hafnium precursor is decreased, but the concentration of the hafnium precursor is high, the hafnium precursor is chemisorbed on most of the available surface sites of the surface of the fin structure 112 after the step of FIG. 2F-2, in accordance with some embodiments.

In the narrow trench 158, since the chemisorption force of the hafnium precursor is decreased, and the concentration of the hafnium precursor is low, the hafnium precursor is chemisorbed on a portion of the available surface sites of the surface of the fin structure 114 after the step of FIG. 2F-2, in accordance with some embodiments.

After the step of FIG. 2F-2, a first ratio of the occupied surface sites (of the surface of the fin structure 112) to the total of the surface sites (of the surface of the fin structure 112) is greater than a second ratio of the occupied surface sites (of the surface of the fin structure 114) to the total of the surface sites (of the surface of the fin structure 114), in accordance with some embodiments.

As shown in FIG. 2F-3, $H_2O$ (i.e., an oxygen precursor or a second precursor) is pulsed onto the surfaces of the fin structures 112 and 114, in accordance with some embodiments. Since the wide trench 156 is wider than the narrow trench 158, the concentration of the oxygen precursor in the wide trench 156 is greater than the concentration of the oxygen precursor in the narrow trench 158, in accordance with some embodiments.

As shown in FIG. 2F-4, the oxygen precursor is chemisorbed on the available surface sites (i.e., OHfCl groups) of the surfaces of the fin structures 112 and 114, and a by-product including hydrogen chloride (HCl) is produced, in accordance with some embodiments. As shown in FIG. 2F-4, the excess oxygen precursor and the by-product are purged away by flowing an inert gas, such as nitrogen ($N_2$) or argon (Ar), in accordance with some embodiments.

As shown in FIG. 2F-5, a next ALD cycle, which includes the steps of FIG. 2F-1 to FIG. 2F-4, is performed over the fin structures 112 and 114, in accordance with some embodiments. Thereafter, as shown in FIG. 2F, the gate dielectric layer 210 is formed after performing several ALD cycles (e.g. 2 cycles to 30 cycles), each of which includes the steps of FIG. 2F-1 to FIG. 2F-4, in accordance with some embodiments.

As shown in FIG. 2F-5, the deposition rate of the $HfO_2$ layer (i.e., the gate dielectric layer 210) in the wide trench 156 is greater than the deposition rate of the $HfO_2$ layer in the narrow trench 158, in accordance with some embodiments.

The deposition rate of the gate dielectric layer 210 (e.g. the $HfO_2$ layer) is affected by the concentration of the precursors (e.g. the hafnium precursor and the oxygen precursor) and the chemisorption force of the precursors, in accordance with some embodiments. Since the chemisorption forces of the precursors in the wide trench 156 and the narrow trench 158 are substantially the same as each other and both decreased, the deposition rate of the gate dielectric layer 210 is mainly affected by the concentration of the precursors, in accordance with some embodiments.

The concentration of the precursors is affected by a structural obstruction in the flow path of the precursors, in accordance with some embodiments. Therefore, the deposition rate of the gate dielectric layer 210 in the wide trench 156, which has a relatively small structural obstruction, is greater than that in the narrow trench 158, which has a relatively large structural obstruction, in accordance with some embodiments.

Similarly, in the same trench (e.g. the wide trench 156 or the narrow trench 158), the deposition rate of the gate dielectric layer 210 at a lower position, which has a relatively large structural obstruction, is less than that at a higher position, which has a relatively small structural obstruction.

As shown in FIG. 2F, the gate dielectric layer 210 has parts 211, 212, 213, 214, and 215, in accordance with some embodiments. The parts 211, 212, 213, 214, and 215 are formed simultaneously, in accordance with some embodiments. The part 211 conformally covers the portion 112a of the fin structure 112, in accordance with some embodiments. The part 212 conformally covers inner walls 156a of the wide trench 156, in accordance with some embodiments.

The part 213 conformally covers top surfaces 182, 172, and 151 of the insulating layer 180, the etch stop layer 170, and the spacer structure 150, in accordance with some embodiments. The part 214 conformally covers the portion 114a of the fin structure 114, in accordance with some embodiments. The part 215 conformally covers inner walls 158a of the narrow trench 158, in accordance with some embodiments.

The gate dielectric layer 210 in the narrow trench 158 is thinner than the gate dielectric layer 210 in the wide trench 156, in accordance with some embodiments. In some embodiments, a thickness T214 of the part 214 is less than a thickness T211 of the part 211. The thickness T214 ranges from about 7 Å to about 15 Å, in accordance with some embodiments. The thickness T211 ranges from about 8 Å to about 20 Å, in accordance with some embodiments.

The difference between the thicknesses T211 and T214 ranges from about 1 Å to about 5 Å, in accordance with some embodiments. If the difference between the thicknesses T211 and T214 is less than 1 Å, the difference is too small to satisfy different requirements of different transistors subsequently formed over the fin structures 112 and 114, in accordance with some embodiments.

If the difference between the thicknesses T211 and T214 is greater than 5 Å, the thickness T211 may be too large, which is not conducive to the switching speed of the transistor having the part 211 of the gate dielectric layer 210, or the thickness T214 may be too small, which is not conducive to the electrical insulation of a gate from a channel in the fin structure 114.

Since the difference between the thicknesses T211 and T214 is small (1 Å to 5 Å), the gate dielectric layer 210 is formed using an ALD process, not a traditional chemical vapor deposition process, in accordance with some embodiments. In some embodiments, a thickness T215 of the part 215 is less than a thickness T212 of the part 212.

In the wide trench 156, the concentration of the ALD precursor at a lower position is less than that at a higher position, and therefore the deposition rate of the gate dielectric layer 210 at the lower position is less than that at the higher position, in accordance with some embodiments. As a result, in the wide trench 156, the gate dielectric layer 210 at the lower position is thinner than the gate dielectric layer 210 at the higher position, in accordance with some embodiments. In some embodiments, the thickness T211 of the part 211 is less than the thickness T212 of the part 212. In some embodiments, the thickness T212 of the part 212 is less than the thickness T213 of the part 213.

In the narrow trench 158, the concentration of the ALD precursor at a lower position is less than that at a higher position, and therefore the deposition rate of the gate dielectric layer 210 at the lower position is less than that at the higher position, in accordance with some embodiments. As a result, in the narrow trench 158, the gate dielectric layer 210 at a lower position is thinner than the gate dielectric layer 210 at a higher position, in accordance with some embodiments. In some embodiments, the thickness T214 of the part 214 is less than the thickness T215 of the part 215. In some embodiments, the thickness T215 of the part 215 is less than the thickness T213 of the part 213.

Figure 2G:
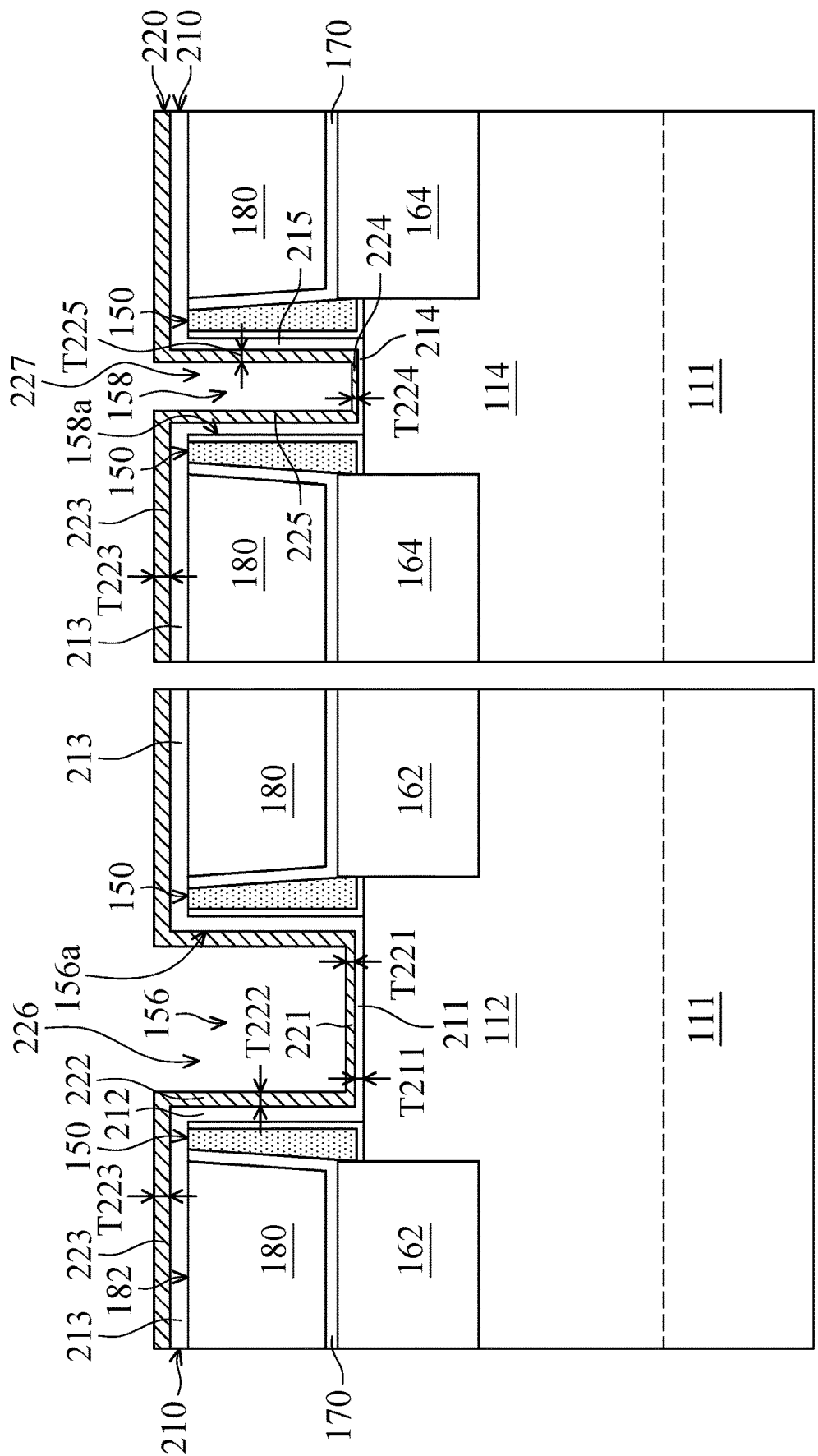

Thereafter, as shown in FIG. 2G, a work function layer 220 is deposited over the gate dielectric layer 210 using an atomic layer deposition process, in accordance with some embodiments. The work function layer 220 is also referred to as a metal-containing layer, in accordance with some embodiments. The work function layer 220 provides a desired work function for a transistor to enhance device performance. The work function layer 220 is formed in the wide trench 156 and the narrow trench 158 simultaneously, in accordance with some embodiments.

The work function layer 220 has trenches 226 and 227, in accordance with some embodiments. The trenches 226 and 227 are respectively in the wide trench 156 and the narrow trench 158, in accordance with some embodiments. The work function layer 220 in the narrow trench 158 is thinner than the work function layer 220 in the wide trench 156, in accordance with some embodiments. Therefore, the trench 227 is widened, which helps the subsequently formed gate electrode layer to completely fill the trench 227, in accordance with some embodiments.

The work function layer 220 has parts 221, 222, 223, 224, and 225, in accordance with some embodiments. The part 221 conformally covers the part 211 of the gate dielectric layer 210 over the fin structure 112, in accordance with some embodiments. The part 222 conformally covers the part 212 of the gate dielectric layer 210 over the inner walls 156a of the wide trench 156, in accordance with some embodiments.

The part 223 conformally covers the part 213 over the top surface 182 of the insulating layer 180, in accordance with some embodiments. The part 224 conformally covers the part 214 over the fin structure 114, in accordance with some embodiments. The part 225 conformally covers the part 215 over the inner walls 158a of the narrow trench 158, in accordance with some embodiments.

In the atomic layer deposition process, the concentration of the ALD precursor in the narrow trench 158 is less than that in the wide trench 156, and therefore the deposition rate of the work function layer 220 in the narrow trench 158 is less than that in the wide trench 156, in accordance with some embodiments. As a result, the work function layer 220 in the narrow trench 158 is thinner than the work function layer 220 in the wide trench 156, in accordance with some embodiments.

In some embodiments, a thickness T224 of the part 224 is less than a thickness T221 of the part 221. The thickness T224 ranges from about 8 Å to about 40 Å, in accordance with some embodiments. The thickness T221 ranges from about 12 Å to about 50 Å, in accordance with some embodiments. The difference between the thicknesses T221 and T224 ranges from about 1 Å to about 3 Å, in accordance with some embodiments. In some embodiments, a thickness T225 of the part 225 is less than a thickness T222 of the part 222.

In the wide trench 156, the concentration of the ALD precursor at a lower position is less than that at a higher position, and therefore the deposition rate of the work function layer 220 at the lower position is less than that at the higher position, in accordance with some embodiments. As a result, in the wide trench 156, the work function layer 220 at the lower position is thinner than the work function layer 220 at the higher position, in accordance with some embodiments.

In some embodiments, the thickness T221 of the part 221 is less than the thickness T222 of the part 222. In some embodiments, the thickness T222 of the part 222 is less than the thickness T223 of the part 223.

In the narrow trench 158, the concentration of the ALD precursor at a lower position is less than that at a higher position, and therefore the deposition rate of the work function layer 220 at the lower position is less than that at the higher position, in accordance with some embodiments. As a result, in the narrow trench 158, the work function layer 220 at a lower position is thinner than the work function layer 220 at a higher position, in accordance with some embodiments.

In some embodiments, the thickness T224 of the part 224 is less than the thickness T225 of the part 225. In some embodiments, the thickness T225 of the part 225 is less than the thickness T223 of the part 223. The thickness T221 of the part 221 is less than the thickness T211 of the part 211 of the gate dielectric layer 210, in accordance with some embodiments.

In the embodiments of forming a PMOS transistor, the work function layer 220 is used to provide a work function value suitable for the device, such as equal to or greater than about 4.8 eV. The work function layer 220 may be made of metal, metal carbide, metal nitride, other suitable materials, or a combination thereof. For example, the work function layer 220 is made of titanium, titanium nitride, other suitable materials, or a combination thereof.

In the embodiments of forming an NMOS transistor, the work function layer 220 is used to provide a work function value suitable for the device, such as equal to or less than about 4.5 eV. The work function layer 220 may be made of metal, metal carbide, metal nitride, or a combination thereof. For example, the work function layer 220 is made of tantalum, tantalum nitride, or a combination thereof.

In some embodiments, a precursor used in the atomic layer deposition process includes an inorganic precursor. The inorganic precursor includes chlorine, in accordance with some embodiments. If the work function layer 220 is made of TiN, the precursor includes $TiCl_4$ and $NH_3$, in accordance with some embodiments.

In some embodiments, a process temperature of the atomic layer deposition process ranges from about 550° C. to about 600° C. The chemisorption force of the ALD precursor is decreased when the process temperature is increased, in accordance with some embodiments.

If the process temperature is less than 550° C., the chemisorption force of the ALD precursor is large, which is not conducive to the formation of the work function layer 220 with different thicknesses in different trenches with different aspect ratios, in accordance with some embodiments. If the process temperature is greater than 600° C., the ALD precursor tends to decompose, in accordance with some embodiments.

Figure 2H:
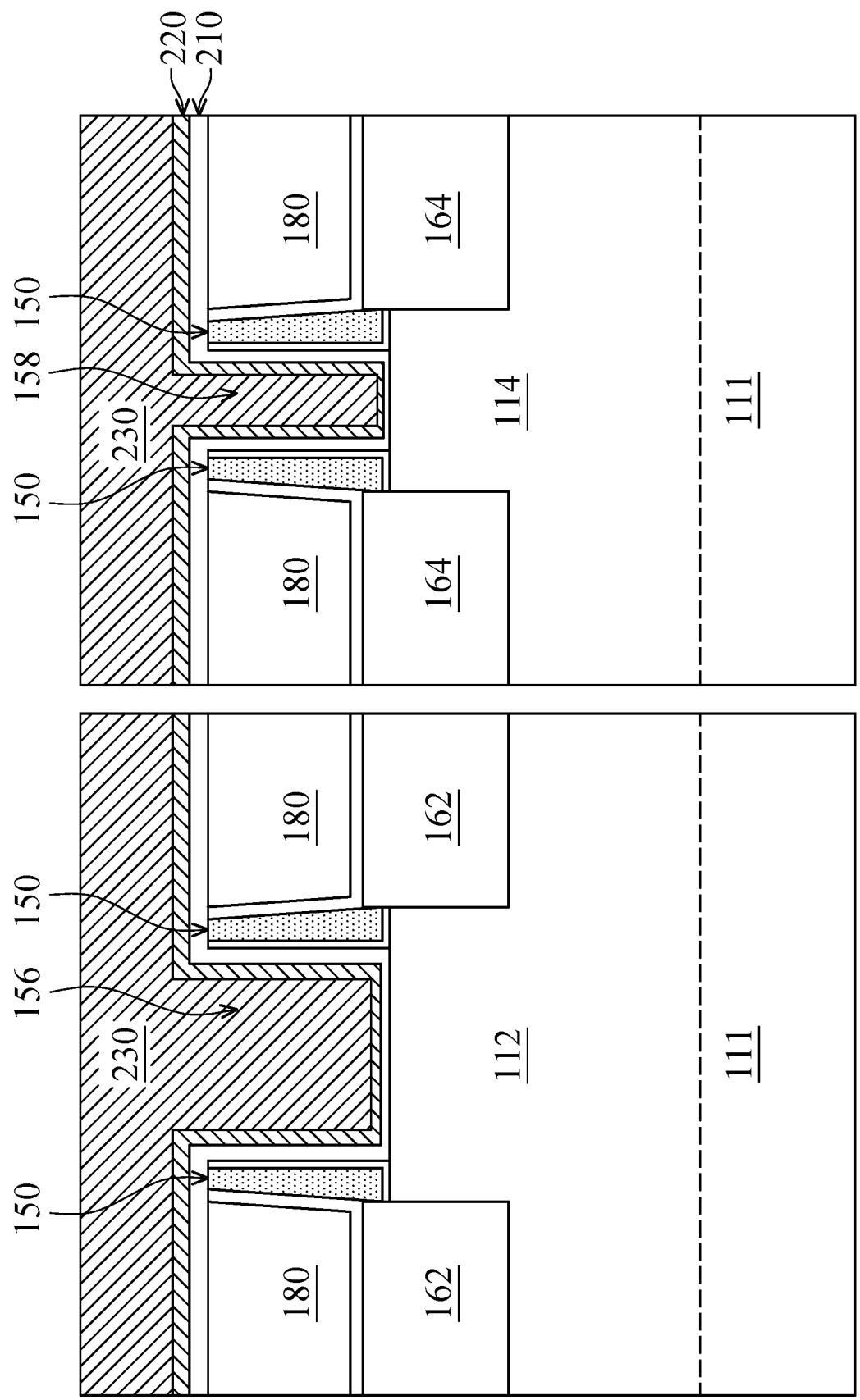

As shown in FIG. 2H, a gate electrode layer 230 is formed over the work function layer 220, in accordance with some embodiments. The gate electrode layer 230 is formed in the wide trench 156 and the narrow trench 158, in accordance with some embodiments. The gate electrode layer 230 is made of a suitable conductive material, such as metal (e.g., aluminum, tungsten, gold, platinum, or cobalt), an alloy thereof, or a combination thereof, in accordance with some embodiments. The gate electrode layer 230 is formed using a deposition process such as a physical vapor deposition (PVD) process, a chemical vapor deposition (CVD) process, or an atomic layer deposition (ALD) process, in accordance with some embodiments.

Figure 2I:
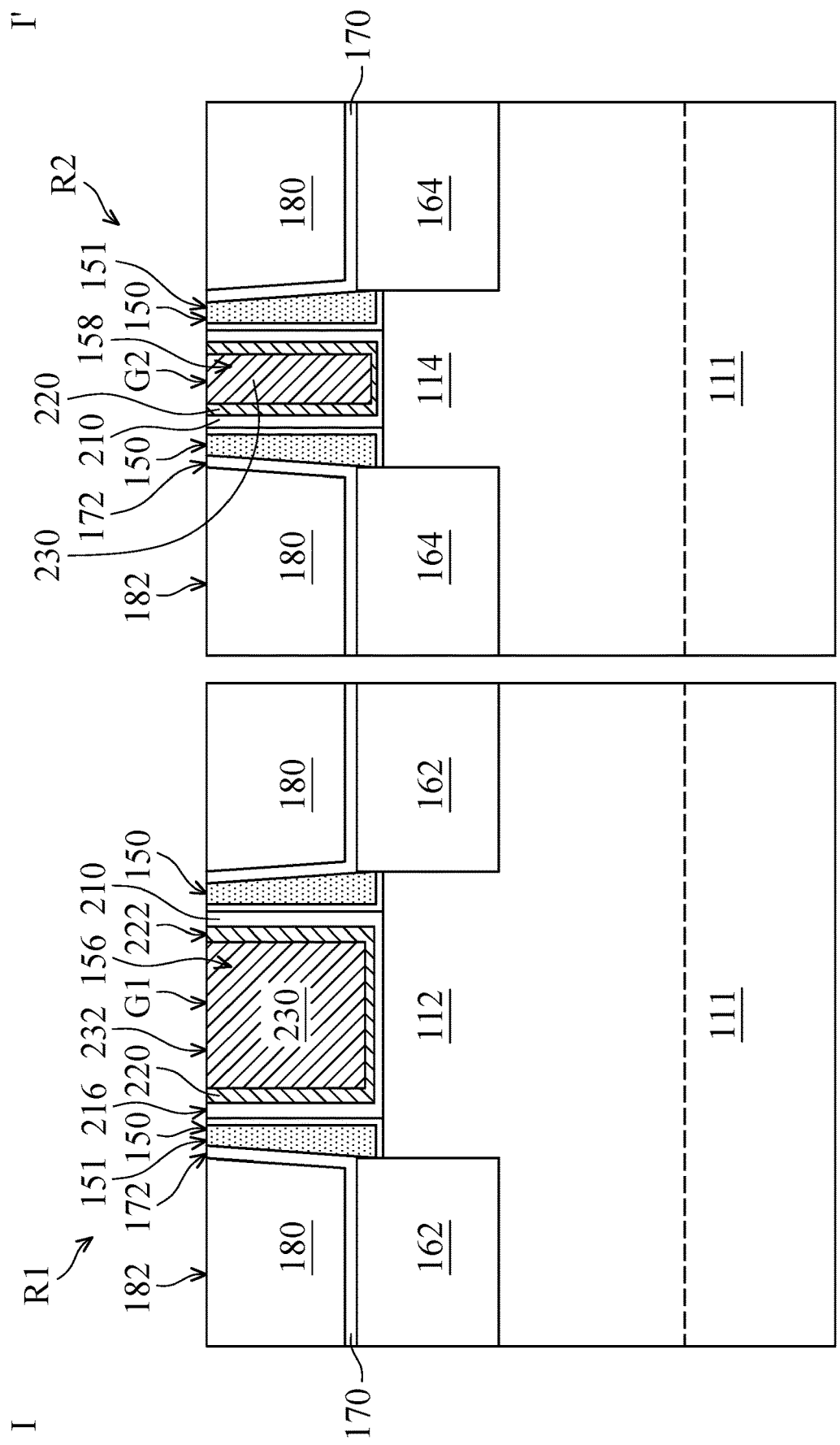
Figures 1, 2I:
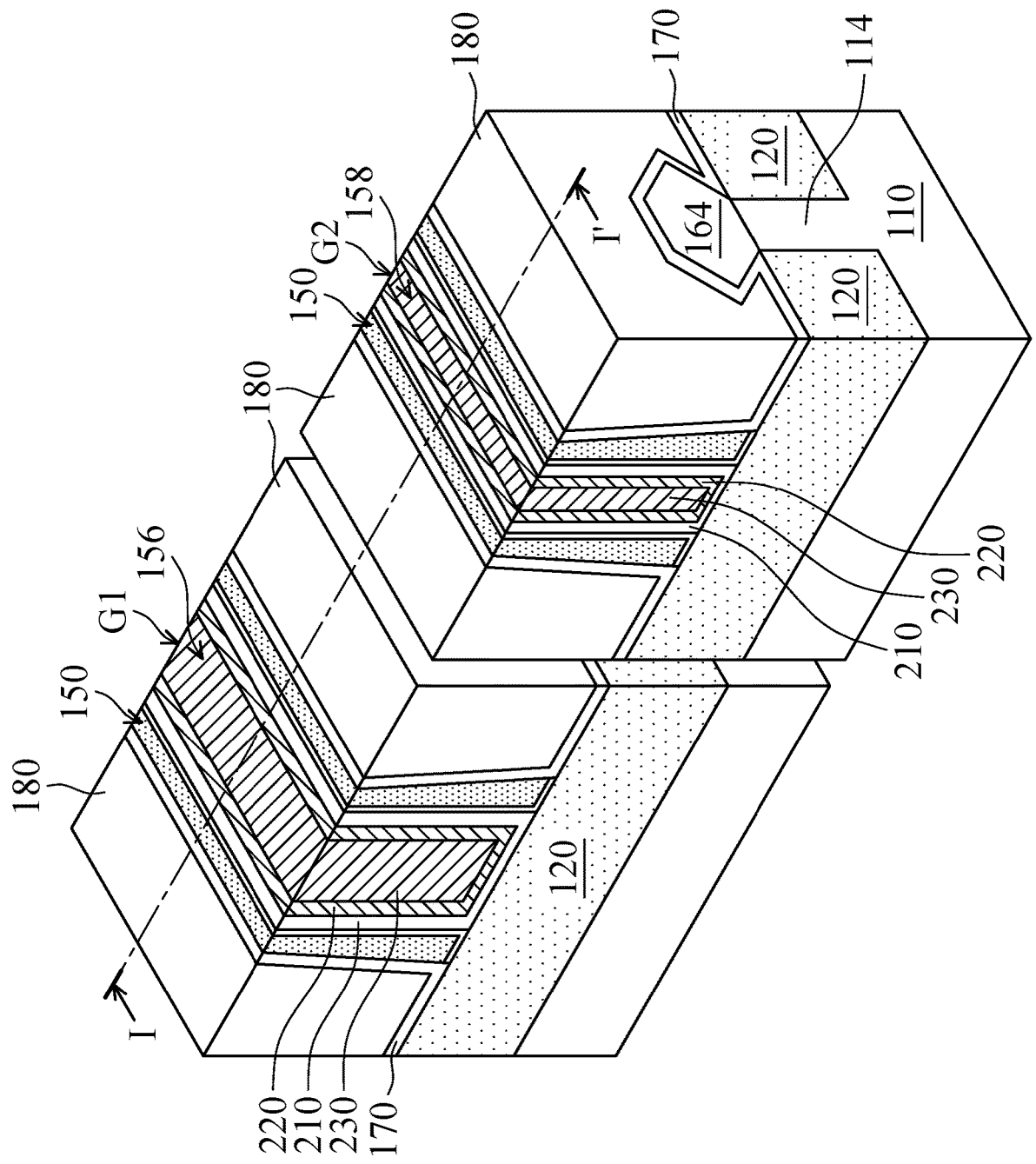

FIG. 2I-1 is a perspective view of the semiconductor device structure of FIG. 2I, in accordance with some embodiments. FIG. 2I is a cross-sectional view illustrating the semiconductor device structure along a sectional line I-I' in FIG. 2I-1, in accordance with some embodiments.

As shown in FIGS. 2I and 2I-1, the gate dielectric layer 210, the work function layer 220, and the gate electrode layer 230 outside of the wide trench 156 and the narrow trench 158 are removed, in accordance with some embodiments. The top surfaces 216, 222, 232, 151, 172, and 182 of the gate dielectric layer 210, the work function layer 220, the gate electrode layer 230, the spacer structure 150, the etch stop layer 170, and the insulating layer 180 are substantially coplanar, in accordance with some embodiments. The term "substantially coplanar" in the application may include small deviations from coplanar geometries. The deviations may be due to manufacturing processes.

The gate dielectric layer 210, the work function layer 220, and the gate electrode layer 230 remaining in the wide trench 156 together form a gate stack G1, in accordance with some embodiments. The gate stack G1 and the stressors 162 (including a source structure and a drain structure) together form a transistor R1, in accordance with some embodiments. The transistor R1 includes a metal-oxide-semiconductor field-effect transistor (MOSFET), in accordance with some embodiments.

The gate dielectric layer 210, the work function layer 220, and the gate electrode layer 230 remaining in the narrow trench 158 together form a gate stack G2, in accordance with some embodiments. The gate stack G2 and the stressors 164 (including a source structure and a drain structure) together form a transistor R2, in accordance with some embodiments. The removal process includes a planarization process such as a chemical mechanical polishing (CMP) process, in accordance with some embodiments.

According to the above description, the gate dielectric layer 210 (with different thicknesses) and the work function layer 220 (with different thicknesses) are formed by decreasing the chemisorption force of the ALD precursors, in accordance with some embodiments. The method for decreasing the chemisorption force of the ALD precursors includes using an inorganic ALD precursors and increasing the ALD process temperature, in accordance with some embodiments.

The gate dielectric layer 210 with different thicknesses is formed in a single ALD process using the inorganic ALD precursors and performed at a high temperature, in accordance with some embodiments. Therefore, the formation of the gate dielectric layer 210 is simple and does not need additional photolithography processes, additional etching processes, and/or additional ALD processes, in accordance with some embodiments. As a result, the process cost is lowered, and the process time is shortened, in accordance with some embodiments. Furthermore, the thin portion of the gate dielectric layer 210 is self-aligned with the narrow trench 158, and therefore the yield rate of the transistor R2, which has the thin portion of the gate dielectric layer 210, is improved, in accordance with some embodiments. The formation of the work function layer 220 has similar advantages, in accordance with some embodiments.

Figure 2J:
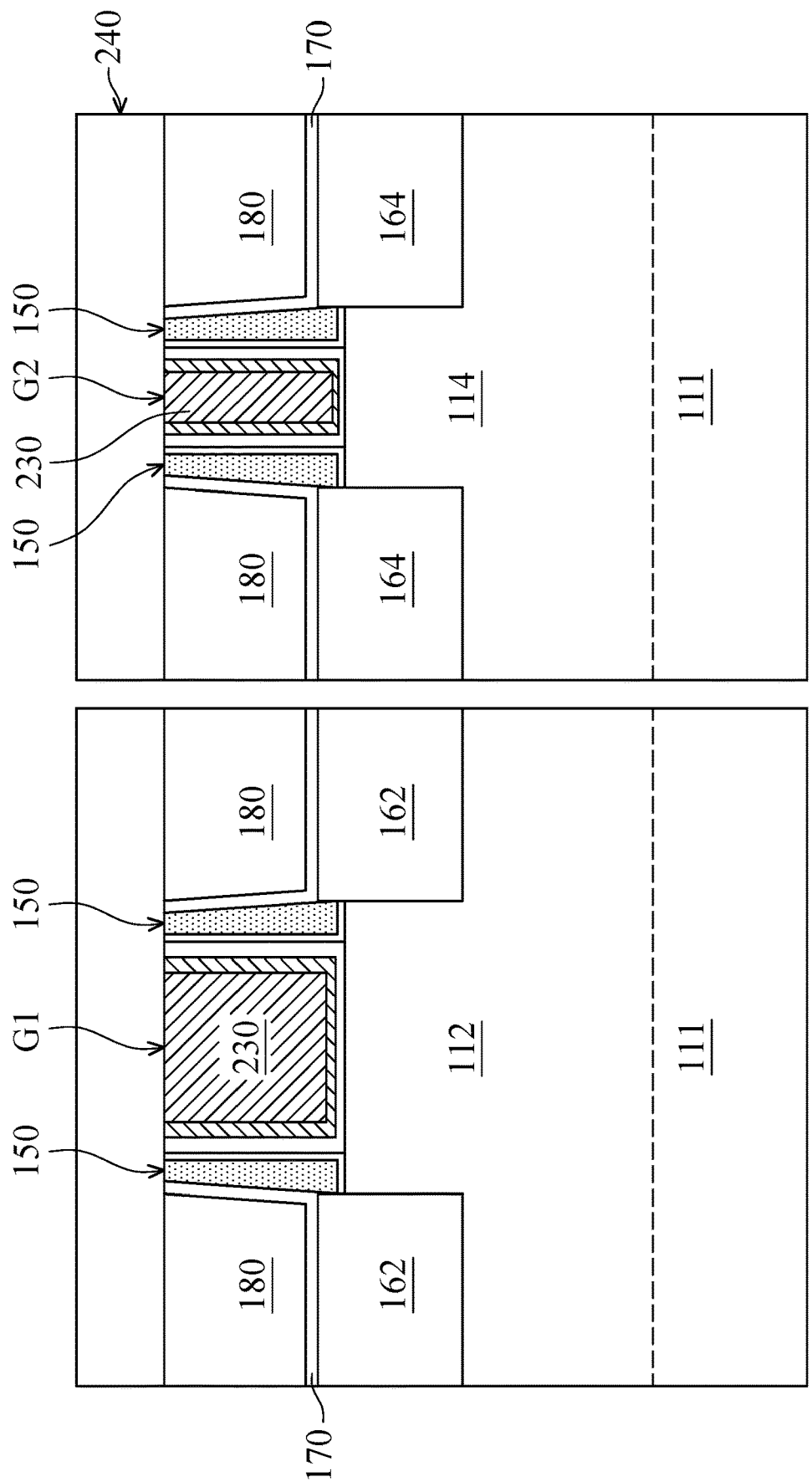

As shown in FIG. 2J, an insulating layer 240 is formed over the gate stacks G1 and G2, the spacer structure 150, the etch stop layer 170, and the insulating layer 180, in accordance with some embodiments. The insulating layer 240 includes an oxide-containing material such as silicon oxide, in accordance with some embodiments. The insulating layer 240 is formed by a deposition process such as a chemical vapor deposition process, in accordance with some embodiments.

Figure 2K:
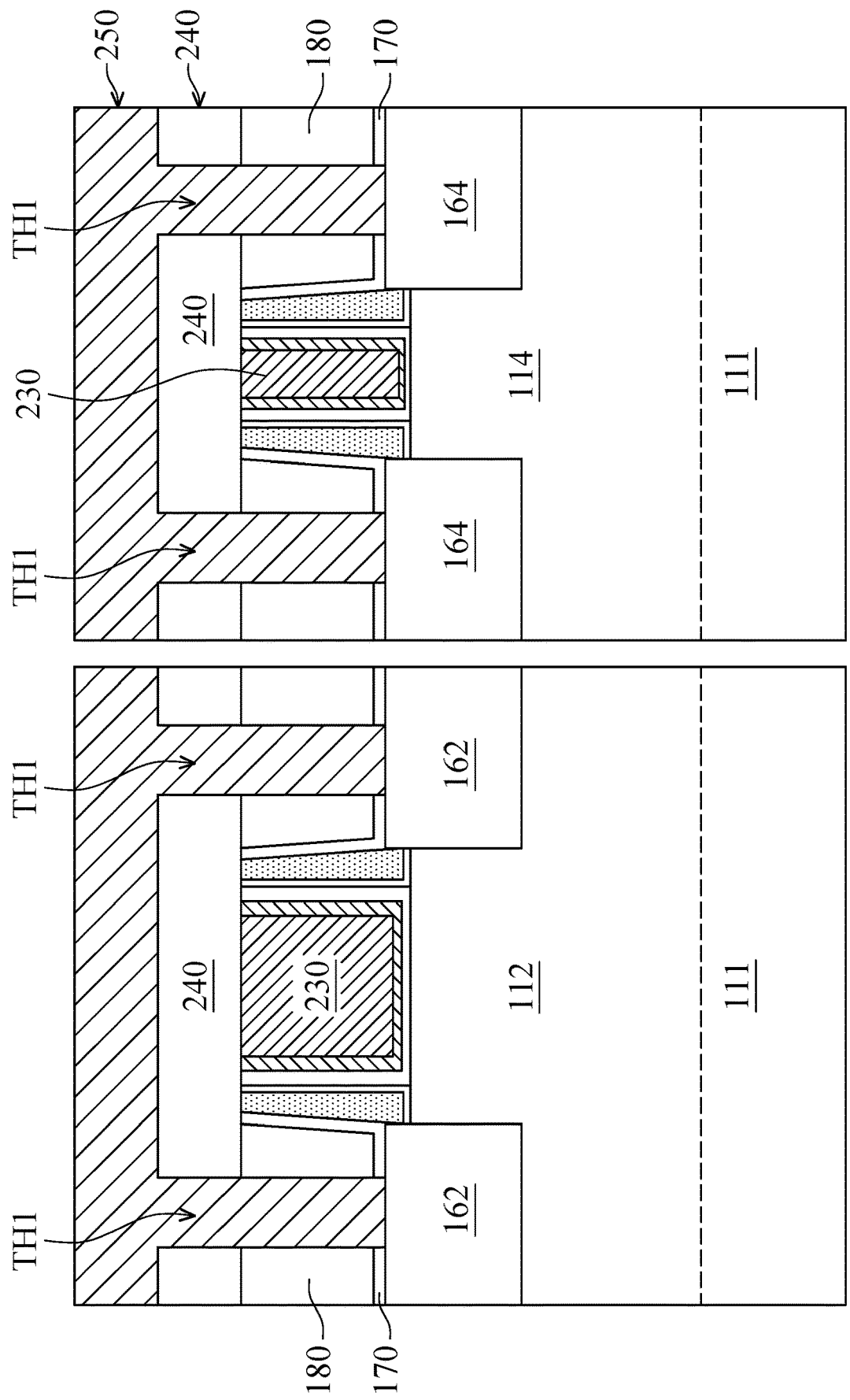

As shown in FIG. 2K, portions of the insulating layers 180 and 240 and the etch stop layer 170 are removed to form through holes TH1 in the insulating layers 180 and 240 and the etch stop layer 170, in accordance with some embodiments. Each through hole TH1 passes through the insulating layers 180 and 240 and the etch stop layer 170 to expose the stressors 162 and 164 thereunder, in accordance with some embodiments. The removal process includes an etching process such as a dry etching process, in accordance with some embodiments.

As shown in FIG. 2K, a conductive layer 250 is formed over the insulating layer 240 and is filled in the through holes TH1, in accordance with some embodiments. The conductive layer 250 is made of a metal material (e.g., tungsten, aluminum, gold, silver, or a combination thereof), an alloy thereof, or another suitable conductive material. The conductive layer 250 is formed using a physical vapor deposition process, a chemical vapor deposition process, or another suitable process.

Figure 2L:
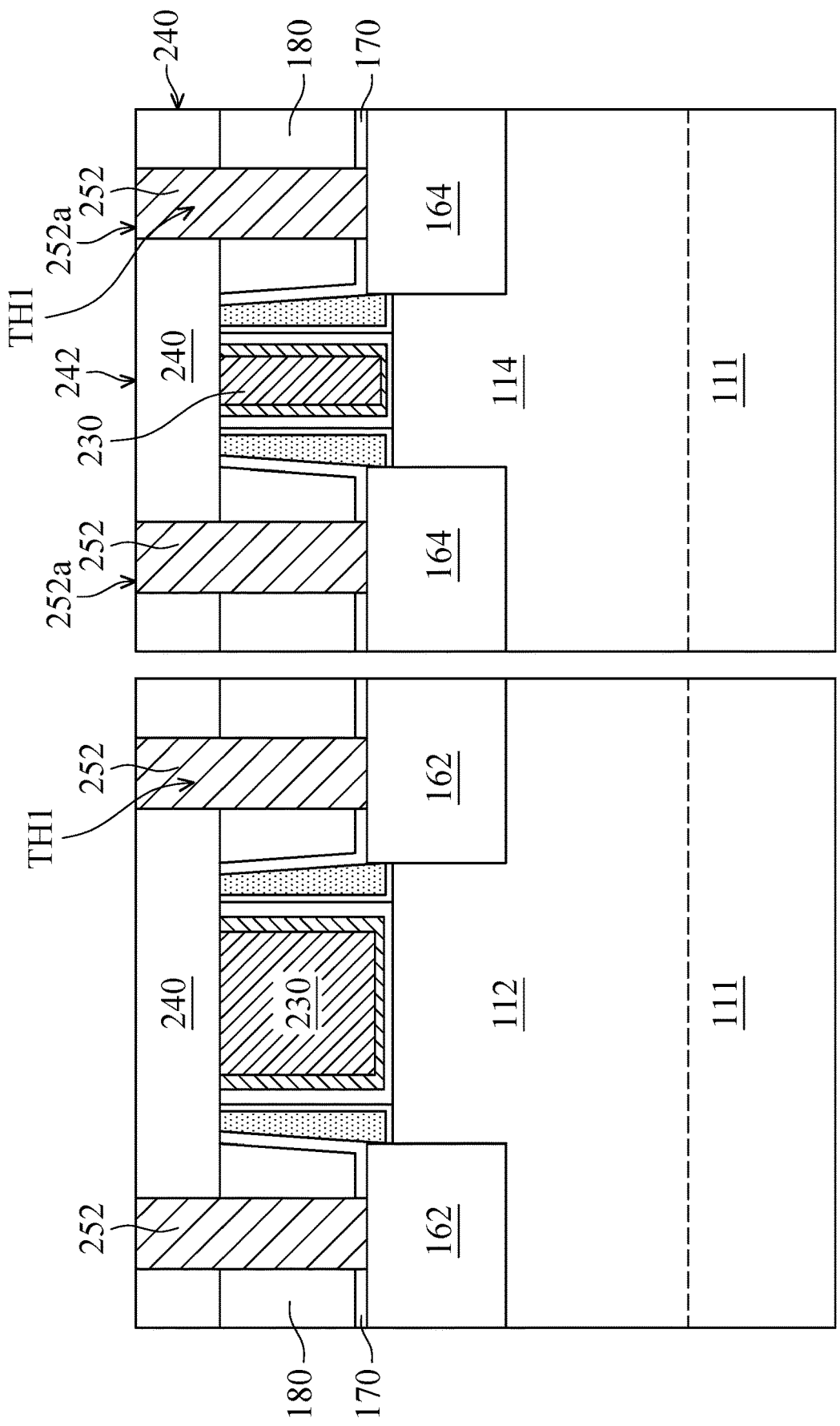

As shown in FIG. 2L, the conductive layer 250 outside of the through holes TH1 is removed, in accordance with some embodiments. The conductive layer 250 remaining in the through holes TH1 forms contact structures 252, in accordance with some embodiments. Each contact structure 252 passes through the insulating layers 180 and 240 and the etch stop layer 170 to connect to the stressors 162 and 164 thereunder, in accordance with some embodiments.

The removal process includes a planarization process such as a chemical mechanical polishing (CMP) process, in accordance with some embodiments. The top surfaces 252a and 242 of the contact structures 252 and the insulating layer 240 are substantially coplanar, in accordance with some embodiments.

Figure 3A:
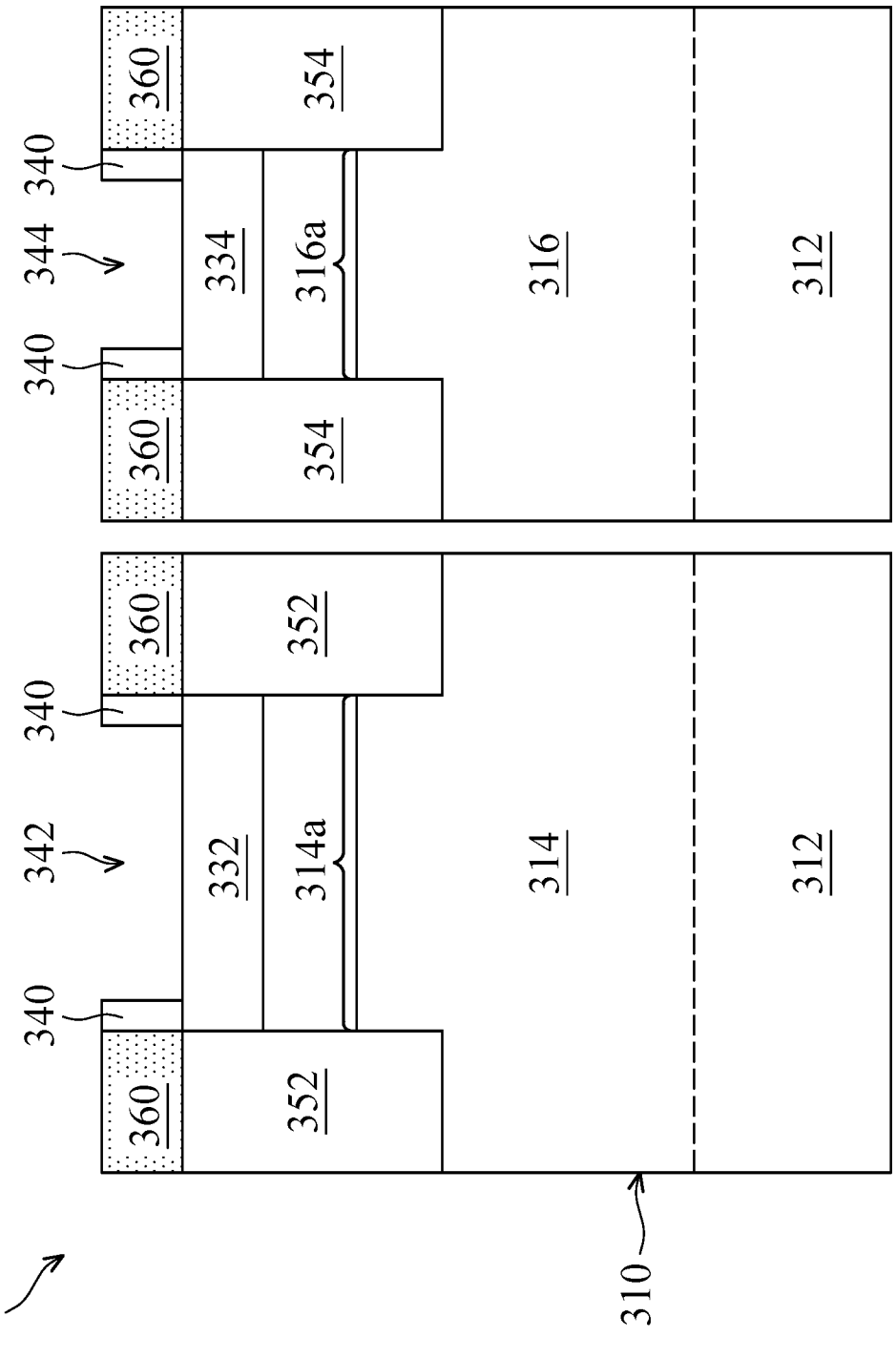
FIGS. 3A-3C are cross-sectional views of various stages of a process for forming a semiconductor device structure, in accordance with some embodiments.
Figures 1, 3A:
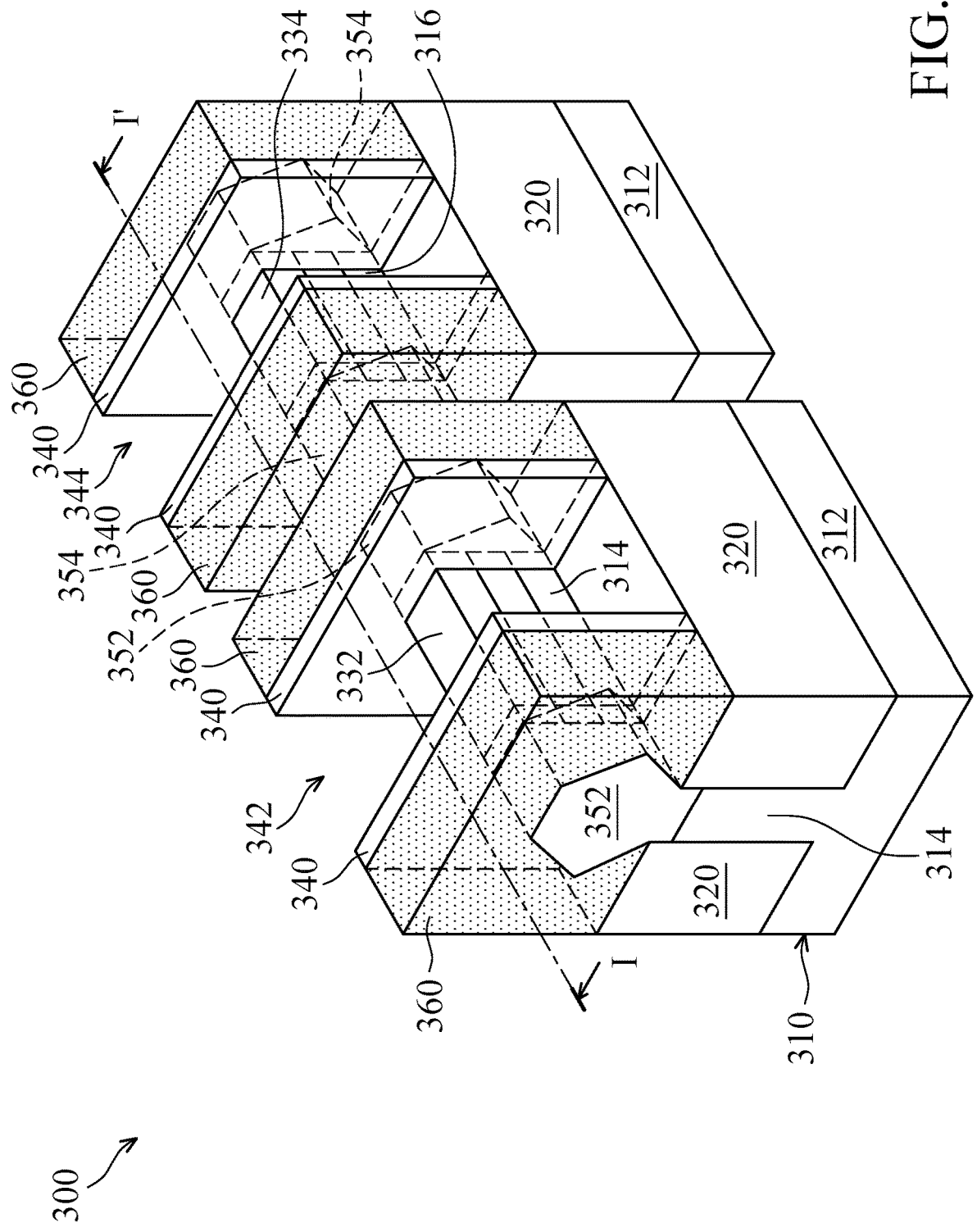
Figure 3B:
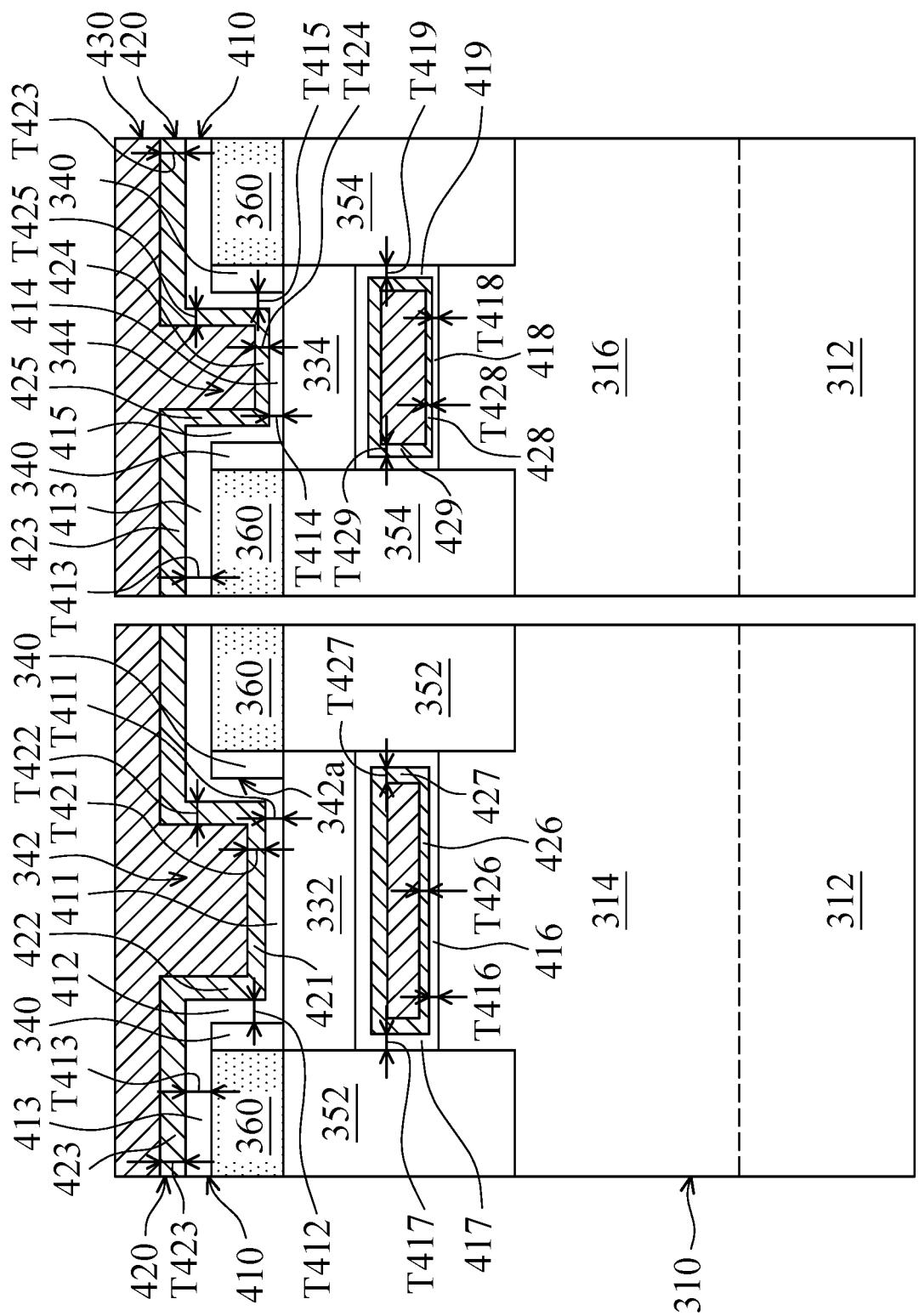
Figure 3C:
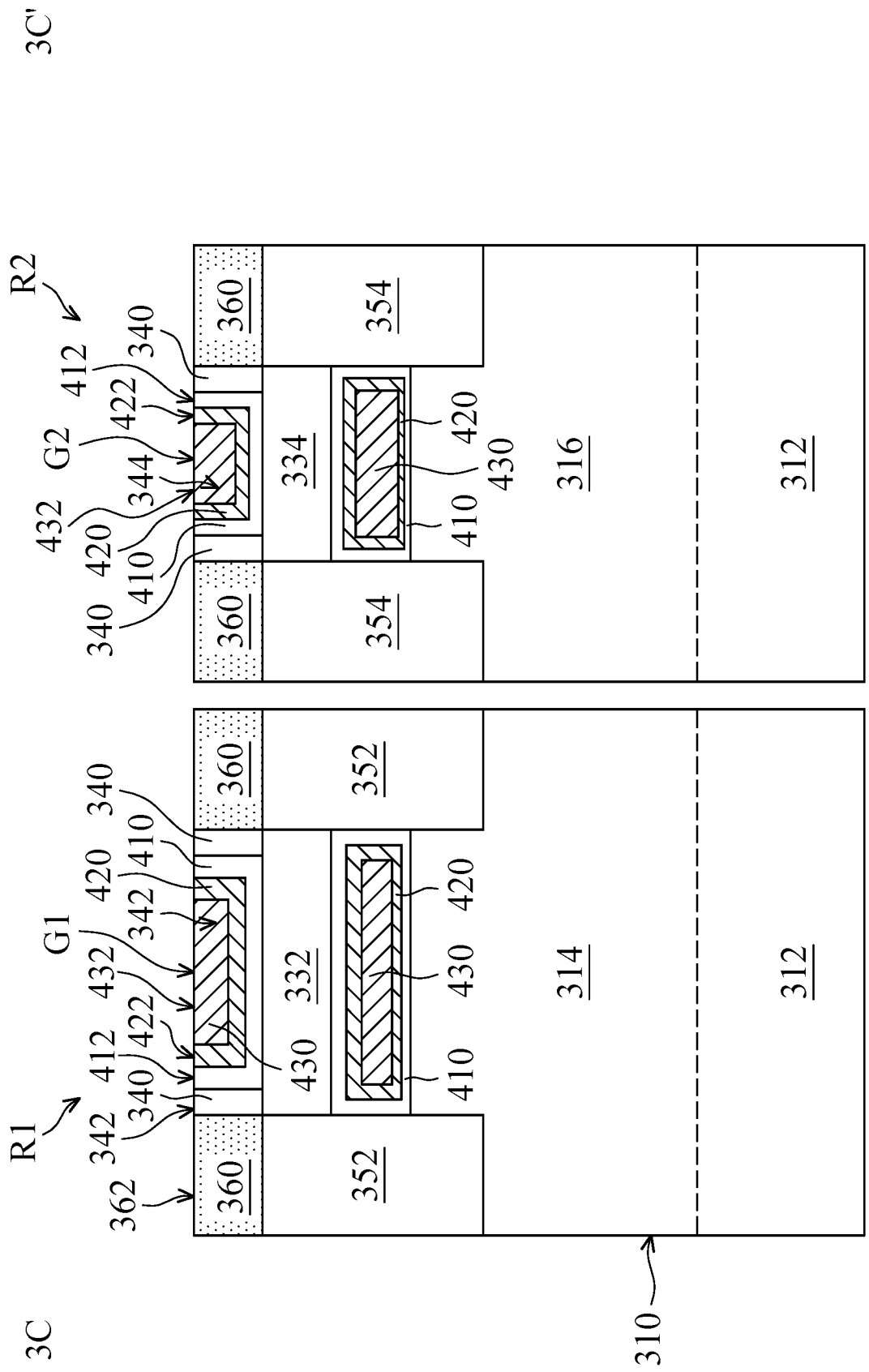
Figures 1, 3C:
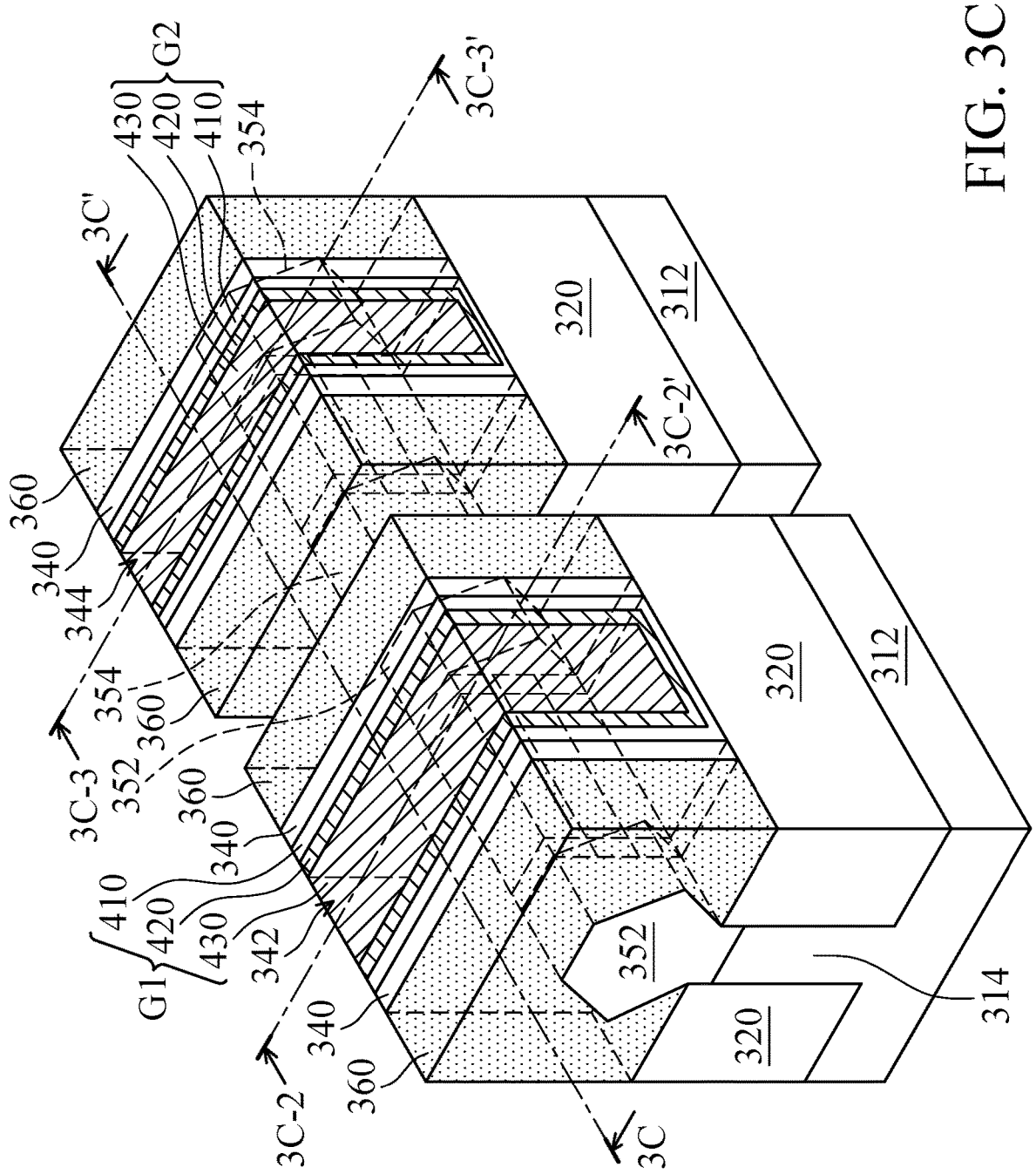
Figures 2, 3C:
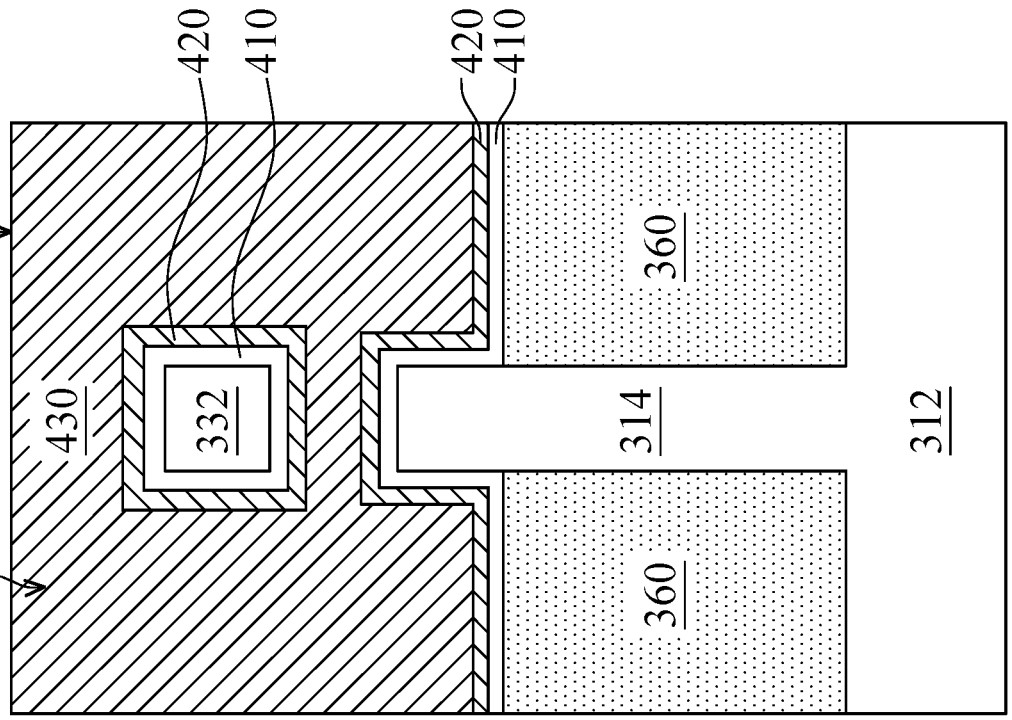
Figures 3, 3C:
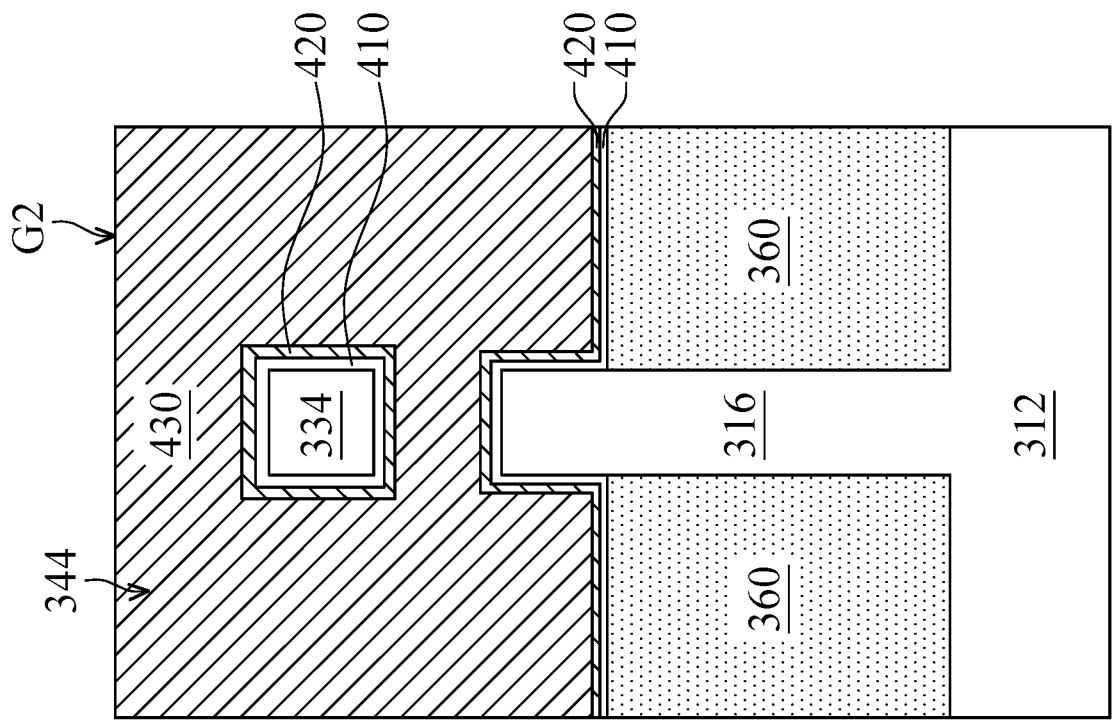

FIGS. 3A-3C are cross-sectional views of various stages of a process for forming a semiconductor device structure, in accordance with some embodiments. FIG. 3A-1 is a perspective view of the semiconductor device structure of FIG. 3A, in accordance with some embodiments. FIG. 3A is a cross-sectional view illustrating the semiconductor device structure along a sectional line I-I' in FIG. 3A-1, in accordance with some embodiments.

As shown in FIGS. 3A and 3A-1, a semiconductor device structure 300 is provided, in accordance with some embodiments. The semiconductor device structure 300 includes a substrate 310, an isolation layer 320, nanostructures 332 and 334, a spacer structure 340, stressors 352 and 354, and an insulating layer 360, in accordance with some embodiments. The substrate 310 includes a base 312 and fin structures 314 and 316, in accordance with some embodiments. The fin structures 314 and 316 are over the base 312, in accordance with some embodiments.

The substrate 310 includes, for example, a semiconductor substrate. The semiconductor substrate includes, for example, a semiconductor wafer (such as a silicon wafer) or a portion of a semiconductor wafer. In some embodiments, the substrate 310 is made of an elementary semiconductor material including silicon or germanium in a single crystal, polycrystal, or amorphous structure.

In some other embodiments, the substrate 310 is made of a compound semiconductor, such as silicon carbide, gallium arsenide, gallium phosphide, indium phosphide, indium arsenide, an alloy semiconductor, such as SiGe or GaAsP, or a combination thereof. The substrate 310 may also include multi-layer semiconductors, semiconductor on insulator (SOI) (such as silicon on insulator or germanium on insulator), or a combination thereof.

The isolation layer 320 is formed over the base 312 and surrounds the fin structures 314 and 316, in accordance with some embodiments. The lower portions of the fin structures 314 and 316 are embedded in the isolation layer 320, in accordance with some embodiments. The isolation layer 320 is made of oxide (such as silicon dioxide) or another suitable insulating material, in accordance with some embodiments.

The nanostructures 332 and 334 are formed over the fin structures 314 and 316 respectively, in accordance with some embodiments. The nanostructures 332 and 334 are spaced apart from the fin structures 314 and 316 respectively, in accordance with some embodiments.

The nanostructures 332 and 334 are made of an elementary semiconductor material including silicon or germanium in a single crystal, polycrystal, or amorphous structure. In some other embodiments, the nanostructures 332 and 334 are made of a compound semiconductor, such as silicon carbide, gallium arsenide, gallium phosphide, indium phosphide, indium arsenide, an alloy semiconductor, such as SiGe or GaAsP, or a combination thereof.

The spacer structure 340 is formed over the nanostructures 332 and 334, the fin structures 314 and 316, and the isolation layer 320, in accordance with some embodiments. The spacer structure 340 has a wide trench 342 and a narrow trench 344, in accordance with some embodiments. The wide trench 342 partially exposes the nanostructure 332 and the fin structure 314, in accordance with some embodiments. The narrow trench 344 partially exposes the nanostructure 334 and the fin structure 316, in accordance with some embodiments.

The spacer structure 340 is made of an insulating material such as silicon nitride, silicon dioxide, silicon oxynitride, or silicon carbide, in accordance with some embodiments. The spacer structure 340 may include a single layer or multiple layers. The spacer structure 340 is in direct contact with the nanostructures 332 and 334, the fin structures 314 and 316, and the isolation layer 320, in accordance with some embodiments.

The stressors 352 are formed over the fin structure 314, in accordance with some embodiments. The stressors 352 are positioned on opposite sides of the nanostructure 332 and on opposite sides of the fin structure 314, in accordance with some embodiments. The stressors 352 are in direct contact with the nanostructure 332 and the fin structure 314, in accordance with some embodiments. The stressors 352 include a source structure and a drain structure, in accordance with some embodiments.

The stressors 354 are formed over the fin structure 316, in accordance with some embodiments. The stressors 354 are positioned on opposite sides of the nanostructure 334 and on opposite sides of the fin structure 316, in accordance with some embodiments. The stressors 354 are in direct contact with the nanostructure 334 and the fin structure 316, in accordance with some embodiments. The stressors 354 include a source structure and a drain structure, in accordance with some embodiments.

In some embodiments, the stressors 352 and 354 are made of a semiconductor material (e.g., silicon) with N-type dopants, such as the Group VA element, in accordance with some embodiments. The Group VA element includes phosphor (P), antimony (Sb), or another suitable Group VA material.

In some other embodiments, the stressors 352 and 354 are made of a semiconductor material (e.g., silicon germanium) with P-type dopants, such as the Group IIIA element, in accordance with some embodiments. The Group IIIA element includes boron or another suitable material. The stressors 352 and 354 are formed using an epitaxial process, in accordance with some embodiments.

The insulating layer 360 is formed over the stressors 352 and 354 and the isolation layer 320, in accordance with some embodiments. The insulating layer 360 includes an oxide-containing material such as silicon oxide, in accordance with some embodiments.

After the step of FIG. 3A, as shown in FIG. 3B, a gate dielectric layer 410 is formed in the wide trench 342 and the narrow trench 344 using an atomic layer deposition (ALD) process, in accordance with some embodiments. The gate dielectric layer 410 conformally and continuously covers the spacer structure 340, the insulating layer 360, the fin structures 314 and 316, and the nanostructures 332 and 334, in accordance with some embodiments.

The gate dielectric layer 410 has parts 411, 412, 413, 414, 415, 416, 417, 418, and 419, in accordance with some embodiments. The parts 411, 412, 413, 414, 415, 416, 417, 418, and 419 are respectively over the nanostructure 332, the sidewalls 342a of the wide trench 342, the insulating layer 360, the nanostructure 334, the sidewalls of the narrow trench 344, the fin structure 314, the sidewalls of the stressors 352, the fin structure 316, and the sidewalls of the stressors 354, in accordance with some embodiments.

The gate dielectric layer 410 in the narrow trench 344 is thinner than the gate dielectric layer 410 in the wide trench 342, in accordance with some embodiments. In some embodiments, a thickness T418 of the part 418 is less than a thickness T416 of the part 416. In some embodiments, a thickness T419 of the part 419 is less than a thickness T417 of the part 417. In some embodiments, a thickness T414 of the part 414 is less than a thickness T411 of the part 411. In some embodiments, a thickness T415 of the part 415 is less than a thickness T412 of the part 412.

In the wide trench 342, the gate dielectric layer 410 at a lower position is thinner than the gate dielectric layer 410 at a higher position, in accordance with some embodiments. In some embodiments, the thickness T416 of the part 416 is less than the thickness T417 of the part 417. In some embodiments, the thickness T411 of the part 411 is less than the thickness T412 of the part 412. In some embodiments, the thickness T412 of the part 412 is less than the thickness T413 of the part 413.

In the narrow trench 344, the gate dielectric layer 410 at a lower position is thinner than the gate dielectric layer 410 at a higher position, in accordance with some embodiments. In some embodiments, the thickness T418 of the part 418 is less than the thickness T419 of the part 419. In some embodiments, the thickness T414 of the part 414 is less than the thickness T415 of the part 415. In some embodiments, the thickness T415 of the part 415 is less than the thickness T413 of the part 413.

In some embodiments, a dielectric constant of the gate dielectric layer 410 is greater than a dielectric constant of silicon dioxide. The gate dielectric layer 410 is also referred to as a high dielectric-constant (high-k) layer, in accordance with some embodiments.

The gate dielectric layer 410 is made of a high-k dielectric material, such as hafnium dioxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

Thereafter, as shown in FIG. 3B, a work function layer 420 is formed over the gate dielectric layer 410 using an atomic layer deposition (ALD) process, in accordance with some embodiments. The work function layer 420 is also referred to as a metal-containing layer, in accordance with some embodiments. The work function layer 420 provides a desired work function for a transistor to enhance device performance.

The work function layer 420 has parts 421, 422, 423, 424, 425, 426, 427, 428, and 429, in accordance with some embodiments. The parts 421, 422, 423, 424, 425, 426, 427, 428, and 429 are respectively over the parts 411, 412, 413, 414, 415, 416, 417, 418, and 419 of the gate dielectric layer 410, in accordance with some embodiments.

The work function layer 420 in the narrow trench 344 is thinner than the work function layer 420 in the wide trench 342, in accordance with some embodiments. In some embodiments, a thickness T428 of the part 428 is less than a thickness T426 of the part 426. In some embodiments, a thickness T429 of the part 429 is less than a thickness T427 of the part 427. In some embodiments, a thickness T424 of the part 424 is less than a thickness T421 of the part 421. In some embodiments, a thickness T425 of the part 425 is less than a thickness T422 of the part 422.

In the wide trench 342, the work function layer 420 at a lower position is thinner than the work function layer 420 at a higher position, in accordance with some embodiments. In some embodiments, the thickness T426 of the part 426 is less than the thickness T427 of the part 427. In some embodiments, the thickness T421 of the part 421 is less than the thickness T422 of the part 422. In some embodiments, the thickness T422 of the part 422 is less than the thickness T423 of the part 423.

In the narrow trench 344, the work function layer 420 at a lower position is thinner than the work function layer 420 at a higher position, in accordance with some embodiments. In some embodiments, the thickness T428 of the part 428 is less than the thickness T429 of the part 429. In some embodiments, the thickness T424 of the part 424 is less than the thickness T425 of the part 425. In some embodiments, the thickness T425 of the part 425 is less than the thickness T423 of the part 423.

In the embodiments of forming a PMOS transistor, the work function layer 420 is used to provide a work function value suitable for the device, such as equal to or greater than about 4.8 eV. The work function layer 420 may be made of metal, metal carbide, metal nitride, other suitable materials, or a combination thereof. For example, the work function layer 420 is made of titanium, titanium nitride, other suitable materials, or a combination thereof.

In the embodiments of forming an NMOS transistor, the work function layer 420 is used to provide a work function value suitable for the device, such as equal to or less than about 4.5 eV. The work function layer 420 may be made of metal, metal carbide, metal nitride, or a combination thereof. For example, the work function layer 420 is made of tantalum, tantalum nitride, or a combination thereof.

As shown in FIG. 3B, a gate electrode layer 430 is formed over the work function layer 420, in accordance with some embodiments. The gate electrode layer 430 is made of a suitable conductive material, such as metal (e.g., aluminum, tungsten, gold, platinum, or cobalt), an alloy thereof, or a combination thereof, in accordance with some embodiments. The gate electrode layer 430 is formed using a deposition process such as a physical vapor deposition (PVD) process, a chemical vapor deposition (CVD) process, or an atomic layer deposition (ALD) process, in accordance with some embodiments.

FIG. 3C-1 is a perspective view of the semiconductor device structure of FIG. 3C, in accordance with some embodiments. FIG. 3C-2 is a cross-sectional view illustrating the semiconductor device structure along a sectional line 3C-2-3C-2' in FIG. 3C-1, in accordance with some embodiments. FIG. 3C-3 is a cross-sectional view illustrating the semiconductor device structure along a sectional line 3C-3-3C-3' in FIG. 3C-1, in accordance with some embodiments.

As shown in FIGS. 3C and 3C-1, the gate dielectric layer 410, the work function layer 420, and the gate electrode layer 430 outside of the wide trench 342 and the narrow trench 344 are removed, in accordance with some embodiments. The top surfaces 412, 422, 432, 342, and 362 of the gate dielectric layer 410, the work function layer 420, the gate electrode layer 430, the spacer structure 340, and the insulating layer 360 are substantially coplanar, in accordance with some embodiments.

As shown in FIG. 3C-2, the gate dielectric layer 410, the work function layer 420, and the gate electrode layer 430 surround the nanostructure 332, in accordance with some embodiments. As shown in FIG. 3C-3, the gate dielectric layer 410, the work function layer 420, and the gate electrode layer 430 surround the nanostructure 334, in accordance with some embodiments.

As shown in FIG. 3C, the gate dielectric layer 410, the work function layer 420, and the gate electrode layer 430 remaining in the wide trench 342 together form a gate stack G1, in accordance with some embodiments. The nanostructure 332 laterally passes through the gate stack G1, in accordance with some embodiments. The gate stack G1 and the stressors 352 (including a source structure and a drain structure) together form a transistor R1, in accordance with some embodiments.

The gate dielectric layer 410, the work function layer 420, and the gate electrode layer 430 remaining in the narrow trench 344 together form a gate stack G2, in accordance with some embodiments. The nanostructure 334 laterally passes through the gate stack G2, in accordance with some embodiments. The gate stack G2 and the stressors 354 (including a source structure and a drain structure) together form a transistor R2, in accordance with some embodiments. The removal process includes a planarization process such as a chemical mechanical polishing (CMP) process, in accordance with some embodiments.

Elements designated by the same reference numbers as those in FIGS. 1A to 3C have the structures and the materials similar thereto or the same thereas. Therefore, the detailed descriptions thereof will not be repeated herein.

In accordance with some embodiments, semiconductor device structures and methods for forming the same are provided. The methods (for forming the semiconductor device structure) form a gate dielectric layer with different thicknesses in different trenches using an atomic layer deposition process. The methods adjust the deposition rates in the different trenches by decreasing the chemisorption force of the ALD precursors. Therefore, the methods are able to form the gate dielectric layer with different thicknesses to satisfy different requirements of different devices using only one atomic layer deposition process, without performing additional photolithography processes, additional etching processes, and/or additional ALD processes. As a result, the process cost is lowered, and the process time is shortened.

In accordance with some embodiments, a method for forming a semiconductor device structure is provided. The method includes providing a substrate and an insulating layer over the substrate. The insulating layer has a wide trench and a narrow trench, the wide trench exposes a first portion of the substrate, the narrow trench exposes a second portion of the substrate, and the wide trench is wider than the narrow trench. The method includes depositing a gate dielectric layer over the insulating layer and in the wide trench and the narrow trench using an atomic layer deposition process. A first deposition rate of the gate dielectric layer in the narrow trench is less than a second deposition rate of the gate dielectric layer in the wide trench during the atomic layer deposition process. The method includes forming a gate electrode layer over the gate dielectric layer. The method includes removing the gate dielectric layer and the gate electrode layer outside of the wide trench and the narrow trench.

In accordance with some embodiments, a method for forming a semiconductor device structure is provided. The method includes providing a substrate and an insulating layer over the substrate. The insulating layer has a wide trench and a narrow trench, the wide trench exposes a first portion of the substrate, the narrow trench exposes a second portion of the substrate, and the wide trench is wider than the narrow trench. The method includes forming a gate dielectric layer over the insulating layer and in the wide trench and the narrow trench. The method includes depositing a work function layer over the gate dielectric layer and in the wide trench and the narrow trench using an atomic layer deposition process. A first deposition rate of the work function layer in the narrow trench is less than a second deposition rate of the work function layer in the wide trench during the atomic layer deposition process. The method includes forming a gate electrode layer over the work function layer. The method includes removing the gate dielectric layer, the work function layer, and the gate electrode layer outside of the wide trench and the narrow trench.

In accordance with some embodiments, a method for forming a semiconductor device structure is provided. The method includes providing a substrate and an insulating layer over the substrate. The insulating layer has a first trench and a second trench, the first trench exposes a first portion of the substrate, the second trench exposes a second portion of the substrate, and a first aspect ratio of the first trench is lower than a second aspect ratio of the second trench. The method includes depositing a gate dielectric layer over the insulating layer and in the first trench and the second trench using an atomic layer deposition process. A first deposition rate of the gate dielectric layer over the first portion of the substrate is greater than a second deposition rate of the gate dielectric layer over the second portion of the substrate during the atomic layer deposition process. The method includes forming a gate electrode layer over the gate dielectric layer. The method includes removing the gate dielectric layer and the gate electrode layer outside of the first trench and the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a substrate and an insulating layer over the substrate, wherein the insulating layer has a wide trench and a narrow trench, the wide trench exposes a first portion of the substrate, the narrow trench exposes a second portion of the substrate, and the wide trench is wider than the narrow trench;
   depositing a gate dielectric layer over the insulating layer and in the wide trench and the narrow trench using an atomic layer deposition process, wherein the gate dielectric layer in the narrow trench is thinner than the gate dielectric layer in the wide trench;
   forming a gate electrode layer over the gate dielectric layer; and
   removing the gate dielectric layer and the gate electrode layer outside of the wide trench and the narrow trench.

2. The method for forming the semiconductor device structure as claimed in claim 1, wherein a first part of the gate dielectric layer covering a lower portion of the narrow trench is thinner than a second part of the gate dielectric layer covering an upper portion of the narrow trench.

3. The method for forming the semiconductor device structure as claimed in claim 1, wherein a first part of the gate dielectric layer covering a lower portion of the wide trench is thinner than a second part of the gate dielectric layer covering an upper portion of the wide trench.

4. The method for forming the semiconductor device structure as claimed in claim 1, wherein a precursor used in the atomic layer deposition process comprises an inorganic precursor.

5. The method for forming the semiconductor device structure as claimed in claim 4, wherein the inorganic precursor comprises chlorine and hafnium.

6. The method for forming the semiconductor device structure as claimed in claim 5, wherein the gate dielectric layer is made of hafnium-containing oxides.

7. The method for forming the semiconductor device structure as claimed in claim 5, wherein a process temperature of the atomic layer deposition process ranges from about 400° C. to about 450° C.

8. The method for forming the semiconductor device structure as claimed in claim 1, wherein a first part of the gate dielectric layer covering the second portion of the substrate is thinner than a second part of the gate dielectric layer covering the first portion of the substrate.

9. A method for forming a semiconductor device structure, comprising:
   providing a substrate and an insulating layer over the substrate, wherein the insulating layer has a wide trench and a narrow trench, the wide trench exposes a first portion of the substrate, the narrow trench exposes a second portion of the substrate, and the wide trench is wider than the narrow trench;
   forming a gate dielectric layer over the insulating layer and in the wide trench and the narrow trench;
   depositing a work function layer over the gate dielectric layer and in the wide trench and the narrow trench using an atomic layer deposition process, wherein the work function layer in the narrow trench is thinner than the work function layer in the wide trench;
   forming a gate electrode layer over the work function layer; and removing the gate dielectric layer, the work function layer, and the gate electrode layer outside of the wide trench and the narrow trench.

10. The method for forming the semiconductor device structure as claimed in claim 9, wherein a precursor used in the atomic layer deposition process comprises an inorganic precursor.

11. The method for forming the semiconductor device structure as claimed in claim 10, wherein the inorganic precursor comprises chlorine and zirconium.

12. The method for forming the semiconductor device structure as claimed in claim 11, wherein a process temperature of the atomic layer deposition process ranges from about 550° C. to about 600° C.

13. The method for forming the semiconductor device structure as claimed in claim 11, wherein the gate dielectric layer is made of zirconium-containing oxides.

14. A method for forming a semiconductor device structure, comprising:
   providing a substrate and an insulating layer over the substrate, wherein the insulating layer has a first trench and a second trench, the first trench exposes a first portion of the substrate, the second trench exposes a second portion of the substrate, and a first aspect ratio of the first trench is lower than a second aspect ratio of the second trench;
   depositing a gate dielectric layer over the insulating layer and in the first trench and the second trench using an atomic layer deposition process, wherein a first part of the gate dielectric layer conformally covering the first portion of the substrate is thicker than a second part of the gate dielectric layer conformally covering the second portion of the substrate;
   forming a gate electrode layer over the gate dielectric layer; and
   removing the gate dielectric layer and the gate electrode layer outside of the first trench and the second trench.

15. The method for forming the semiconductor device structure as claimed in claim 14, wherein the first trench and the second trench have a substantially same depth.

16. The method for forming the semiconductor device structure as claimed in claim 14, wherein a first part of the gate dielectric layer covering an upper portion of the second trench is thicker than a second part of the gate dielectric layer covering a lower portion of the second trench.

17. The method for forming the semiconductor device structure as claimed in claim 14, wherein a first part of the gate dielectric layer covering a first inner wall of the second trench is thinner than a second part of the gate dielectric layer covering a second inner wall of the first trench.

18. The method for forming the semiconductor device structure as claimed in claim 14, wherein a precursor used in the atomic layer deposition process comprises an inorganic precursor.

19. The method for forming the semiconductor device structure as claimed in claim 18, wherein the inorganic precursor comprises chlorine and aluminum.

20. The method for forming the semiconductor device structure as claimed in claim 19, wherein the gate dielectric layer is made of aluminum-containing oxides.

* * * * *